(12) United States Patent
Kim et al.

(10) Patent No.: US 12,245,440 B2
(45) Date of Patent: Mar. 4, 2025

(54) SEMICONDUCTOR DEVICE

(71) Applicant: SAMSUNG ELECTRONICS CO., LTD., Suwon-si (KR)

(72) Inventors: Ki Hwan Kim, Seoul (KR); Jeong Ho Yoo, Seongnam-si (KR); Cho Eun Lee, Pocheon-si (KR); Yong Uk Jeon, Hwaseong-si (KR); Young Dae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 419 days.

(21) Appl. No.: 17/692,369

(22) Filed: Mar. 11, 2022

(65) Prior Publication Data

US 2023/0037672 A1 Feb. 9, 2023

(30) Foreign Application Priority Data

Aug. 9, 2021 (KR) .................. 10-2021-0104357

(51) Int. Cl.
| | |
|---|---|
| H01L 29/786 | (2006.01) |
| H01L 29/417 | (2006.01) |
| H01L 29/66 | (2006.01) |
| H10D 30/67 | (2025.01) |
| H10D 64/01 | (2025.01) |

(52) U.S. Cl.
CPC ..... H10D 30/6713 (2025.01); H10D 30/6729 (2025.01); H10D 64/018 (2025.01)

(58) Field of Classification Search
CPC .......... H01L 29/0673; H01L 29/66787; H01L 29/78696
See application file for complete search history.

(56) References Cited

U.S. PATENT DOCUMENTS

| | | | |
|---|---|---|---|
| 7,825,003 B2 | 11/2010 | Gauthier, Jr. et al. | |
| 7,838,887 B2 | 11/2010 | Woon et al. | |
| 8,987,794 B2 | 3/2015 | Rachmady et al. | |
| 9,853,129 B2 | 12/2017 | Bauer et al. | |
| 9,972,716 B2 | 5/2018 | Kim et al. | |

(Continued)

OTHER PUBLICATIONS

European Search Report, dated Oct. 17, 2022, and European Office Action, dated Nov. 3, 2022, for corresponding EP Application No. 22 171 339.9.

*Primary Examiner* — Evren Seven
*Assistant Examiner* — Cole Leon Lindsey
(74) *Attorney, Agent, or Firm* — Muir Patent Law, PLLC

(57) ABSTRACT

A semiconductor includes an active pattern with a lower pattern and sheet patterns spaced apart from the lower pattern in a first direction, a source/drain pattern on the lower pattern, the source/drain pattern being in contact with the sheet patterns, and gate structures on opposite sides of the source/drain pattern, the gate structures being spaced apart from each other along a second direction and including gate electrodes that surround the sheet patterns, wherein the source/drain pattern includes a first epitaxial region having at least one of antimony and bismuth, the first epitaxial region having a bottom part in contact with the lower pattern, but not with the sheet patterns, and a thickness of the bottom part increasing and decreasing away from the gate structures in the second direction, and a second epitaxial region on the first epitaxial region, the second epitaxial region including phosphorus.

20 Claims, 32 Drawing Sheets

(56) References Cited

U.S. PATENT DOCUMENTS

| | | |
|---|---|---|
| 10,115,788 B2 | 10/2018 | Ching et al. |
| 10,553,679 B2 | 2/2020 | Zhang et al. |
| 10,840,381 B2 | 11/2020 | Chang et al. |
| 2017/0330960 A1 | 11/2017 | Bauer et al. |
| 2019/0058052 A1* | 2/2019 | Frougier ............ H01L 29/78696 |
| 2020/0020774 A1* | 1/2020 | Lee ..................... H01L 29/7848 |
| 2020/0135932 A1 | 4/2020 | Wang et al. |
| 2020/0176566 A1 | 6/2020 | Peng et al. |
| 2020/0219976 A1 | 7/2020 | Kim et al. |
| 2021/0028280 A1 | 1/2021 | Liu et al. |
| 2021/0066455 A1 | 3/2021 | Lee et al. |

* cited by examiner

SEMICONDUCTOR DEVICE

CROSS-REFERENCE TO RELATED APPLICATION

This application claims priority to Korean Patent Application No. 10-2021-0104357, filed on Aug. 9, 2021, and all the benefits accruing therefrom under 35 U.S.C. § 119, the disclosure of which is incorporated herein by reference in its entirety.

BACKGROUND

1. Field

The present disclosure relates to a semiconductor device, and particularly, to a semiconductor device including a Multi-Bridge Channel Field Effect Transistor (MBCFET™).

2. Description of the Related Art

As a scaling technique for increasing the density of a semiconductor device, a multi-gate transistor has been suggested, in which a fin-type or a nanowire-type multi-channel active pattern (or silicon body) is formed on a substrate and a gate is formed on the surface of the multi-channel active pattern. Since the multi-gate transistor uses a three-dimensional (3D) channel, scaling can be facilitated. Also, current control capability can be improved without increasing the length of the gate of the multi-gate transistor. Also, a short channel effect (SCE), i.e., a phenomenon in which the potential of a channel region is affected by a drain voltage, can be effectively suppressed.

SUMMARY

According to an aspect of the present disclosure, there is provided a semiconductor device including an active pattern including a lower pattern and a plurality of sheet patterns, which are spaced apart from the lower pattern in a first direction, a source/drain pattern disposed on the lower pattern and in contact with the sheet patterns, and gate structures disposed on both sides, in a second direction, of the source/drain pattern and including gate electrodes, which surround the sheet patterns, wherein the source/drain pattern includes a first epitaxial region, which includes first impurities, and a second epitaxial region, which is on the first epitaxial region and includes second impurities that are different from the first impurities, the first epitaxial region includes a bottom part, which is in contact with the lower pattern, but not with the sheet patterns, the first impurities include at least one of antimony (Sb) and bismuth (Bi), the second impurities include phosphorus (P), and a thickness of the bottom part of the first epitaxial region increases and decreases away from the gate structures in the second direction.

According to another aspect of the present disclosure, there is provided a semiconductor device including an active pattern including a lower pattern and a plurality of sheet patterns, which are spaced apart from the lower pattern in a first direction, a source/drain pattern disposed on the lower pattern and in contact with the sheet patterns, and gate structures disposed on both sides, in a second direction, of the source/drain pattern and including gate electrodes, which surround the sheet patterns, wherein the source/drain pattern includes a first epitaxial region, which is in contact with the lower pattern, a second epitaxial region, which is in contact with the sheet patterns, and a third epitaxial region, which is on the first and second epitaxial regions, the first epitaxial region includes silicon doped with at least one of antimony (Sb) and bismuth (Bi), the second epitaxial region includes silicon (Si) doped with arsenic (As), and the third epitaxial region includes silicon doped with phosphorus (P).

According to still another aspect of the present disclosure, there is provided a semiconductor device including an active pattern including a lower pattern and a plurality of sheet patterns, which are spaced apart from the lower pattern in a first direction, the sheet patterns including a lowermost sheet pattern, which is a closest sheet pattern to the lower pattern, a source/drain pattern disposed on the lower pattern and in contact with the sheet patterns, and gate structures disposed on both sides, in a second direction, of the source/drain pattern and including gate electrodes, which surround the gate electrodes, wherein the source/drain pattern includes a first epitaxial region, which is doped with antimony (Sb), and a second epitaxial region, which is doped with phosphorus (P), the gate structures include a lowermost inner spacer between the lower pattern and the lowermost sheet pattern, and the first epitaxial region is in contact with the lower pattern and includes a bottom part, which covers a part of a sidewall of the lowermost inner spacer.

BRIEF DESCRIPTION OF THE DRAWINGS

Features will become apparent to those of skill in the art by describing in detail exemplary embodiments with reference to the attached drawings, in which.

DETAILED DESCRIPTION

Semiconductor devices according to some embodiments of the present disclosure may include a tunneling field-effect transistor (FET), a three-dimensional (3D) transistor, a two-dimensional (2D) material-based FET, and a heterostructure thereof. Also, semiconductor devices according to some embodiments of the present disclosure may include a bipolar junction transistor, and a laterally-diffused metal-oxide semiconductor (LDMOS) transistor.

A semiconductor device according to some embodiments of the present disclosure will hereinafter be described with reference to FIGS. 1 through 7.

Figure 1:
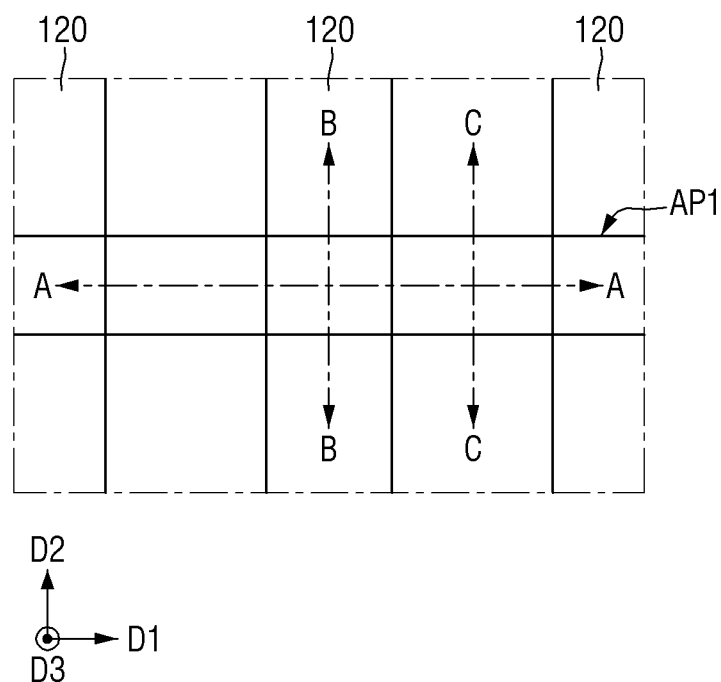
FIG. 1 is a layout view of a semiconductor device according to some embodiments of the present disclosure.
Figure 2:
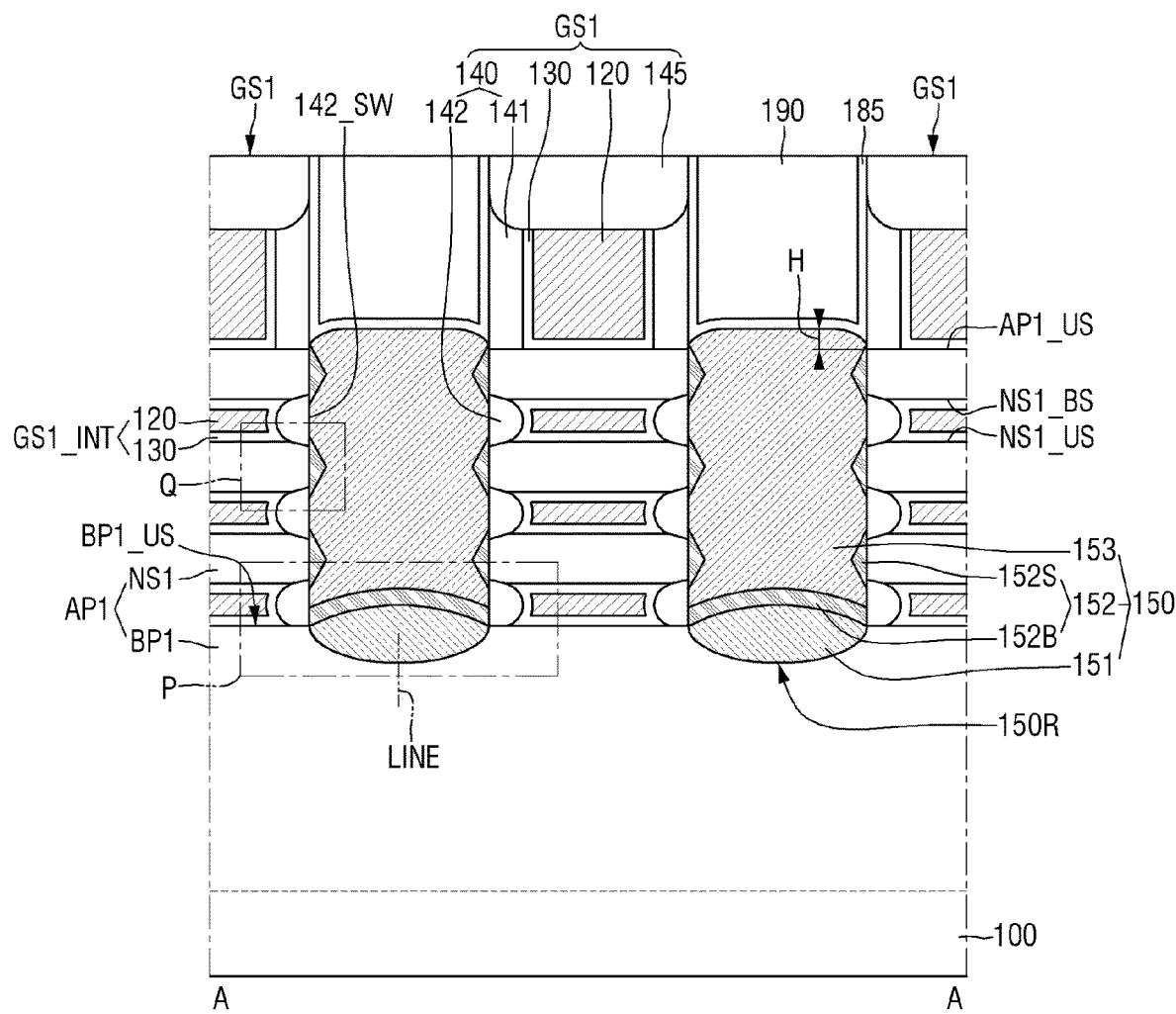
FIG. 2 is a cross-sectional view taken along line A-A of FIG. 1.
Figure 3:
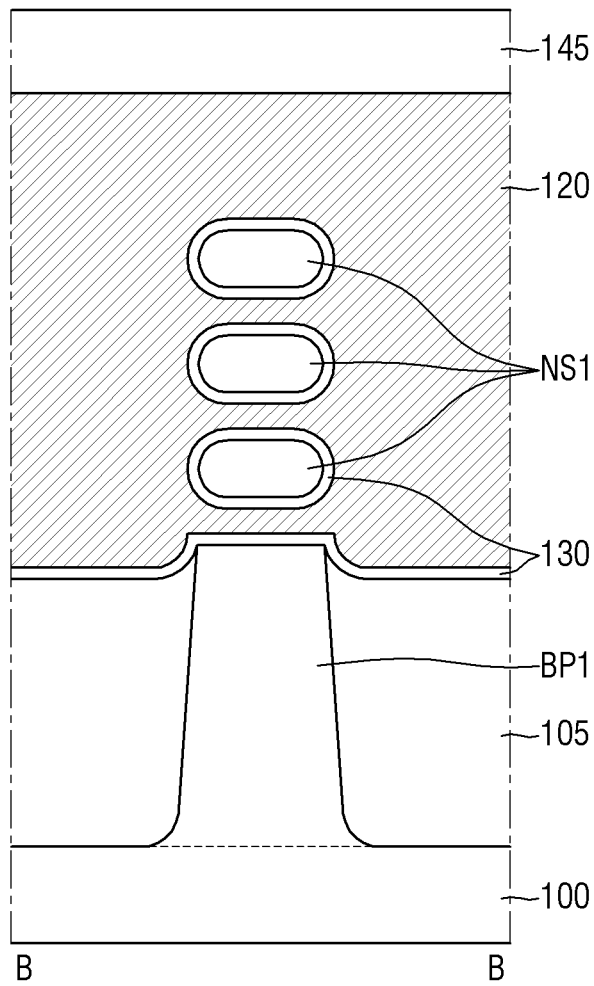
FIG. 3 is a cross-sectional view taken along line B-B of FIG. 1.
Figure 4:
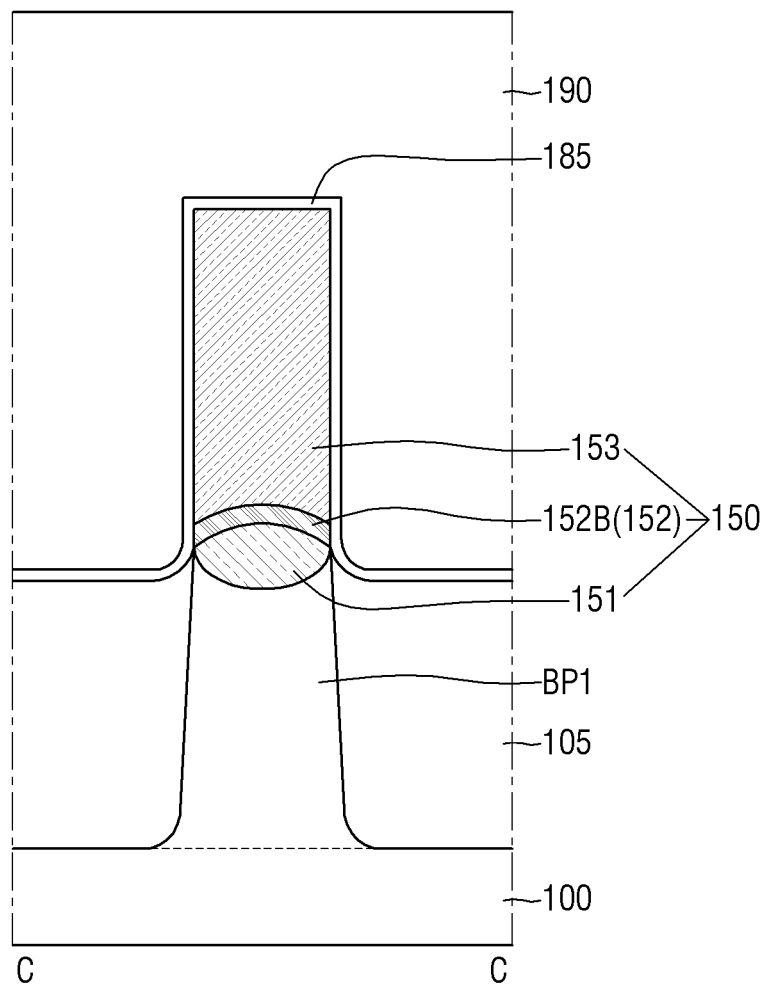
FIG. 4 is a cross-sectional view taken along line C-C of FIG. 1.
Figure 5:
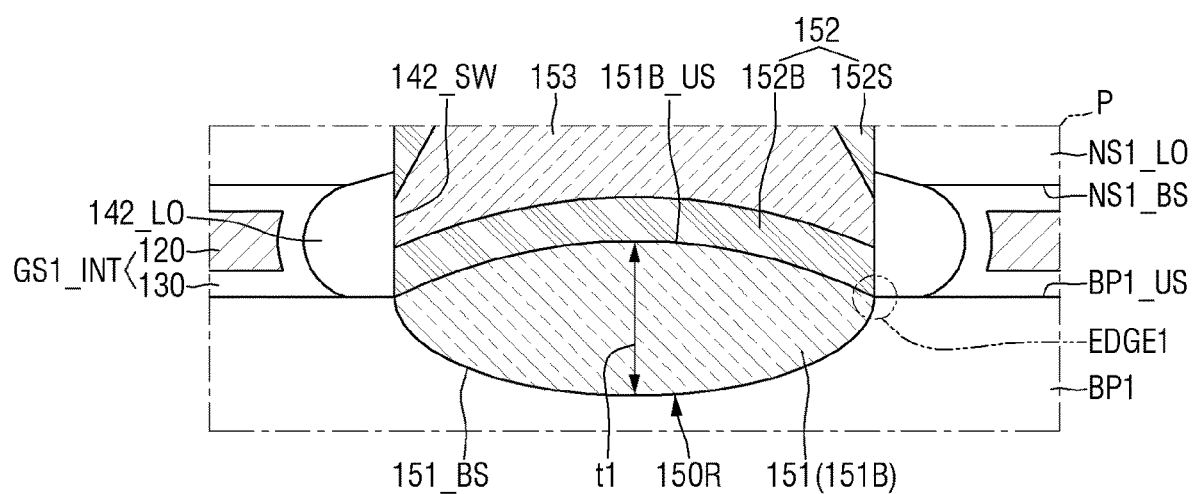
FIGS. 5 and 6 are enlarged cross-sectional views of regions P and Q, respectively, of FIG. 2.
Figure 6:
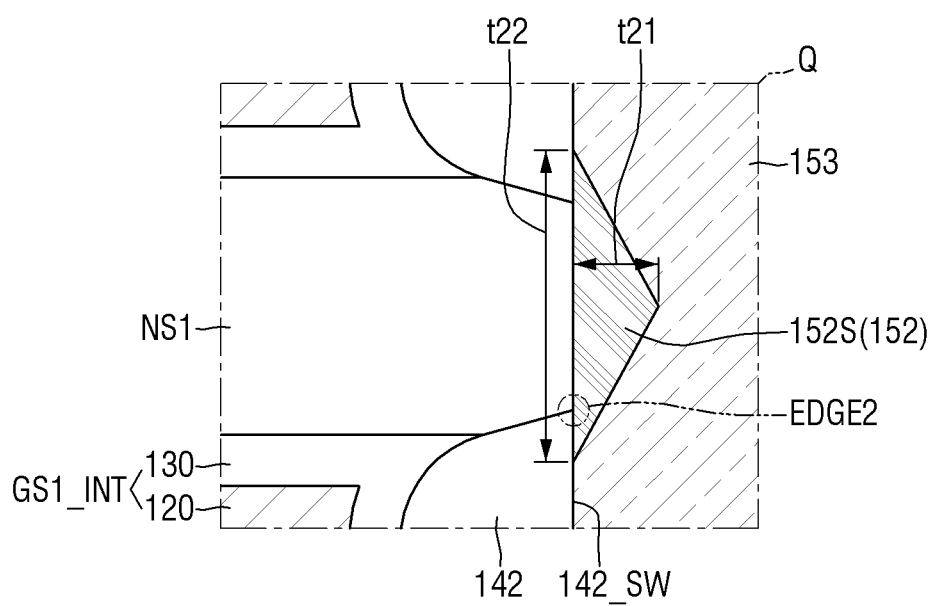
Figure 7:
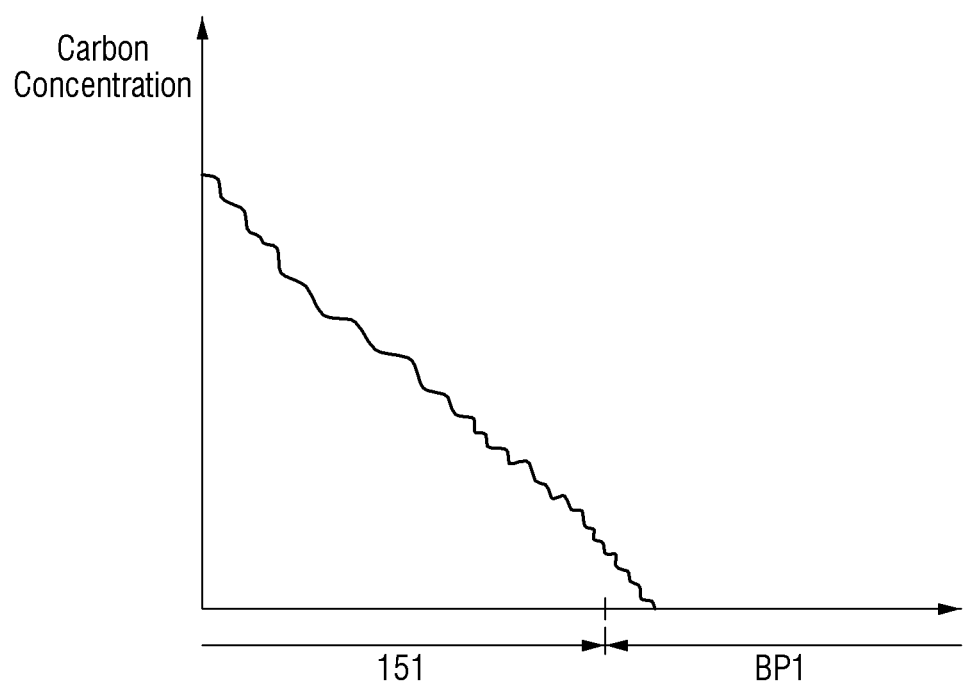
FIG. 7 is a graph showing the concentration of carbon (C) along "LINE" of FIG. 2.

FIG. 1 is a layout view of a semiconductor device according to some embodiments of the present disclosure. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIGS. 5 and 6 are enlarged cross-sectional views of regions P and Q, respectively, of FIG. 2. FIG. 7 is a graph showing the concentration of carbon (C) along "LINE" of FIG. 2.

Referring to FIGS. 1 through 7, a semiconductor device according to some embodiments of the present disclosure may include a first active pattern AP1, a plurality of first gate electrodes 120, and first source/drain patterns 150 on a substrate 100.

For example, the substrate 100 may be a bulk silicon substrate or a silicon-on-insulator (SOI) substrate. In another example, the substrate 100 may be a silicon substrate or may include another material, e.g., silicon germanium (SiGe), silicon germanium-on-insulator (SGOI), indium antimonide, a lead tellurium compound, indium arsenide, indium phosphide, gallium arsenide, or gallium antimonide.

The first active pattern AP1 may be disposed on the substrate 100. The first active pattern AP1 may extend in a first direction D1. For example, the first active pattern AP1 may be disposed in a region where an N-type metal-oxide semiconductor (NMOS) is formed.

For example, the first active pattern AP1 may be a multi-channel active pattern. The first active pattern AP1 may include a first lower pattern BP1 and a plurality of first sheet patterns NS1.

The first lower pattern BP1 may protrude from the substrate 100. The first lower pattern BP1 may extend in the first direction D1.

As illustrated in FIG. 2, the first sheet patterns NS1 may be disposed on an upper surface BP1_US of the first lower pattern BP1. The first sheet patterns NS1 may be spaced apart from the first lower pattern BP1 in a third direction D3. The first sheet patterns NS1 may be spaced apart from one another in the third direction D3.

As illustrated in FIG. 5, the first sheet patterns NS1 may include a lowermost sheet pattern NS1_LO, which is a closest first sheet pattern NS1 to the first lower pattern BP1. No additional sheet patterns may be disposed between the first lower pattern BP1 and the lowermost sheet pattern NS1_LO.

As illustrated in FIG. 2, each of the first sheet patterns NS1 may have an upper surface NS1_US and a bottom surface NS1_BS. The upper surface NS1_US of the first sheet pattern NS1 may be opposite to the bottom surface NS1_BS of the first sheet pattern NS1 in the third direction D3. The third direction D3 may be a direction intersecting both the first and second directions D1 and D2. The third direction D3 may be a thickness direction of the substrate 100, e.g., the third direction D3 may be a vertical direction extending along a normal to a bottom of the substrate 100. The first direction D1 may be a direction intersecting a second direction D2. For example, three first sheet patterns NS1 are illustrated as being arranged in the third direction D3, but the present disclosure is not limited thereto.

The first lower pattern BP1 may be obtained by etching part of the substrate 100 and may include an epitaxial layer grown from the substrate 100. The first lower pattern BP1 may include, e.g., silicon (Si) or germanium (Ge), which is an element semiconductor material. Also, the first lower pattern BP1 may include a compound semiconductor, e.g., a group IV-IV compound semiconductor or a group III-V compound semiconductor.

For example, the group IV-IV compound semiconductor may be a binary or ternary compound containing at least two of, e.g., Si, Ge, and tin (Sn), or a compound obtained by doping the binary or ternary compound with a group IV element. For example, the group compound semiconductor may be a binary, ternary, or quaternary compound obtained by combining at least one of, e.g., aluminum (Al), gallium (Ga), and indium (In), which are group III elements, and one of, e.g., phosphorus (P), arsenic (As), and antimony (Sb), which are group III elements.

The first sheet patterns NS1 may include at least one of an element semiconductor material (e.g., Si or Ge), the group IV-IV compound semiconductor, and the group compound semiconductor. The first sheet patterns NS1 may include the same material as, or a different material from, the first lower pattern BP1. For example, the first lower pattern BP1 may be a Si lower pattern including Si, and the first sheet patterns NS1 may be Si sheet patterns including Si, but embodiments are not limited thereto.

The width, in the second direction D2, of the first sheet patterns NS1 may increase or decrease proportionally to the width, in the second direction D2, of the first lower pattern BP1. For example, the first sheet patterns NS1, which are stacked in the third direction D3, are illustrated as having the same width in the second direction D2, but the present disclosure is not limited thereto. The width, in the second direction D2, of the first sheet patterns NS1, which are stacked in the third direction D3, may decrease away from the first lower pattern BP1.

A field insulating film 105 may be formed on the substrate 100. The field insulating film 105 may be disposed on sidewalls of the first lower pattern BP1. The field insulating film 105 may not be disposed on the upper surface BP1_US of the first lower pattern BP1.

For example, the field insulating film 105 may generally cover the sidewalls of the first lower pattern BP1. In another example, the field insulating film 105 may cover parts of the sidewalls of the first lower pattern BP1, in which case, part of the first lower pattern BP1 may protrude beyond the upper surface of the field insulating film 105 in the third direction D3.

As illustrated in FIG. 3, the first sheet patterns NS1 may be located higher than the upper surface of the field insulating film 105, e.g., relative to the substrate 100. The field insulating film 105 may include, e.g., an oxide film, a nitride film, an oxynitride film, or a combination thereof. The field insulating film 105 is illustrated as being a single-layer film, but the present disclosure is not limited thereto.

As illustrated in FIG. 2, a plurality of first gate structures GS1 may be disposed on the substrate 100. The first gate structures GS1 may extend in the second direction D2. The first gate structures GS1 may be spaced apart from one another in the first direction D1. The first gate structures GS1 may be adjacent to one another in the first direction D1. For example, the first gate structures GS1 may be disposed on both sides, in the first direction D1, of each of the first source/drain patterns 150.

The first gate structures GS1 may be disposed on the first active pattern AP1. The first gate structures GS1 may intersect the first active pattern AP1.

The first gate structures GS1 may intersect the first lower pattern BP1. The first gate structures GS1 may surround each of the first sheet patterns NS1.

For example, the first gate structures GS1 may include the first gate electrodes 120, first gate insulating films 130, first gate spacers 140, and first gate capping patterns 145. The first gate structures GS1 may include first inter-gate structures GS1_INT, which are disposed between the first sheet patterns NS1 that are adjacent to one another in the third direction D3 and between the first lower pattern BP1 and the first sheet patterns NS1. The first inter-gate structures GS1_NT may include the first gate electrodes 120 and the first gate insulating films 130, and the first gate electrodes 120 and the first gate insulating films 130 are disposed between the first sheet patterns NS1 and between the first lower pattern BP1 and the first sheet patterns NS1.

The first gate electrodes 120 may be disposed on the first lower pattern BP1. The first gate electrodes 120 may intersect the first lower pattern BP1. The first gate electrodes 120 may surround the first sheet patterns NS1.

Parts of the first gate electrodes 120 may be disposed between the first sheet patterns NS1, which are adjacent to one another in the third direction D3. In a case where the first sheet patterns NS1 include pairs of lower and upper first sheet patterns NS1 that are adjacent to each other in the third direction D3, parts of the first gate electrodes 120 may be disposed between the upper surface NS1_US of the lower sheet pattern NS1 and the bottom surfaces NS1_BS of the upper first sheet patterns NS1. Parts of the first gate electrodes 120 may also be disposed between the upper surface BS1_US of the first lower pattern BP1 and the bottom surfaces NS1_BS of the lowermost first sheet patterns NS1_LO.

The first gate electrodes 120 include at least one of a metal, a metal alloy, a conductive metal nitride, a metal silicide, a doped semiconductor material, a conductive metal oxide, and a conductive metal oxynitride. The first gate electrodes 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), Al, copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present disclosure is not limited thereto. Here, the conductive metal oxide and the conductive metal oxynitride may include oxides of the aforementioned materials, but the present disclosure is not limited thereto.

The first gate electrodes 120 may be disposed on both sides of each of the first source/drain patterns 150 that will be described later. The first gate structures GS1 may be disposed on both sides, in the first direction D1, of each of the first source/drain patterns 150.

For example, two first gate electrodes 120 on either side of each of the first source/drain patterns 150 may both be normal gate electrodes that are used as the gates of transistors. In another example, one of two first gate electrodes 120 on either side of each of the first source/drain patterns 150 may be a normal gate electrode that is used as the gate of a transistor, and the other first gate electrode 120 may be a dummy gate electrode.

The first gate insulating films 130 may extend along the upper surface of the field insulating film 105 and the upper surface BP1_US of the first lower pattern BP1. The first gate insulating films 130 may surround the first sheet patterns NS1. The first gate insulating films 130 may be disposed along the circumferences of the first sheet patterns NS1. The first gate electrodes 120 are disposed on the first gate insulating films 130. The first gate insulating films 130 are disposed between the first gate electrodes 120 and the first sheet patterns NS1.

Parts of the first gate insulating films 130 may be disposed between the first sheet patterns NS1, which are adjacent to one another in the third direction D3, and between the first lower pattern BP1 and the first sheet patterns NS1. In a case where the first sheet patterns NS1 include the pairs of lower and upper first sheet patterns NS1 that are adjacent to each other in the third direction D3, parts of the first gate insulating films 130 may extend along the upper surfaces NS1_US of the lower first sheet patterns NS1 and the bottom surfaces NS1_BS of the upper first sheet patterns NS1.

The first gate insulating films 130 may include, e.g., silicon oxide, silicon oxynitride, silicon nitride, or a high-k material having a greater dielectric constant than silicon oxide. The high-k material may include, e.g., at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate insulating films 130 are illustrated as being single-layer films, but the present disclosure is not limited thereto, e.g., each of the first gate insulating films 130 may include multiple films. The first gate insulating films 130 may include interfacial layers, which are disposed between the first sheet patterns NS1 and the first gate electrodes 120, and high-k insulating films.

The semiconductor device according to some embodiments of the present disclosure may include negative capacitance (NC) FETs using negative capacitors. For example, the first gate insulating films 130 and the second gate insulating films 230 may include ferroelectric material films having ferroelectric properties and paraelectric material films having paraelectric properties.

The ferroelectric material films may have negative capacitance, and the paraelectric material films may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having negative capacitance and the paraelectric material films having positive capacitance are connected in series, the total capacitance of the ferroelectric material films and the paraelectric material films may increase. Accordingly, transistors having the ferroelectric material films can have a sub-threshold swing (SS) of less than 60 mV/decade at room temperature.

The ferroelectric material films may have ferroelectric properties. The ferroelectric material films may include, e.g., at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material films.

If the ferroelectric material films include hafnium oxide, the dopant of the ferroelectric material films may include, e.g., at least one of Gd, Si, Zr, Al, and Y. If the dopant of the ferroelectric material films is Al, the ferroelectric material films may include 3 atomic % (at %) to 8 at % of Al. The ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include 2 at % to 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may include, e.g., at least one of silicon oxide and a high-k metal oxide. The high-k metal oxide may include, e.g., at least one of hafnium oxide, zirconium oxide, and aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, e.g., 0.5 nm to 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, the first gate insulating films 130 may include one ferroelectric material film. In another example, the first gate insulating films 130 may include a plurality of ferroelectric material films that are spaced apart from one another. The first gate insulating films 130 may have a structure in which a plurality of ferroelectric material films and a plurality of paraelectric material films are alternately stacked.

The first gate spacers 140 may be disposed on the sidewalls of each of the first gate electrodes 120. The first gate spacers 140 may include outer spacers 141 and inner spacers 142. For example, as illustrated in FIG. 2, the outer spacers 141 may be on sidewalls of the gate electrodes 120.

The first gate spacers 140 may include a plurality of inner spacers 142. The inner spacers 142 may be disposed between the first sheet patterns NS1, which are adjacent to one another in the third direction D3. The inner spacers 142 may also be disposed between the first lower pattern BP1 and the lowermost sheet patterns NS1_LO.

The inner spacers 142 may include sidewalls 142_SW of the inner spacers 142. The sidewalls 142_SW of the inner spacers 142 may face, e.g., and directly contact, the first source/drain patterns 150. As illustrated in FIG. 5, the inner spacers 142 may include lowermost inner spacers 142_LO, which are the closest inner spacers 142 to the first lower pattern BP1. The lowermost inner spacers 142_LO may be disposed between the first lower pattern BP1 and the lowermost sheet patterns NS1_LO.

The first gate insulating films 130, which are disposed between the first sheet patterns NS1, may be in contact with the inner spacers 142. The first gate insulating films 130 may extend along the profiles of the inner spacers 142. In other words, the inner spacers 142 may be in, e.g., direct, contact with the first gate insulating films 130 of the first inter-gate structures GS1_INT.

For example, as illustrated in FIG. 2, parts of the first sheet patterns NS1 that form boundaries with the inner spacers 142 may be inclined. During the fabrication of the inner spacers 142, parts of the first sheet patterns NS1 may be etched. That is, referring to FIG. 2, the thickness, in the third direction D3, of the first sheet patterns NS1 may decrease closer to the first source/drain patterns 150, at the boundaries between the first sheet patterns NS1 and the inner spacers 142. For example, as illustrated in FIG. 2, edges of the first sheet patterns NS1, e.g., portions of the first sheet patterns NS1 between inner spacers 142 that are adjacent to each other along the third direction D3, may have a decreasing thickness (as measured in the third direction D3) in direction oriented toward the first source/drain patterns 150.

In another example, the thickness, in the third direction D3, of the first sheet patterns NS1 may be uniform closer to the first source/drain patterns 150, at the boundaries between the first sheet patterns NS1 and the inner spacers 142.

The outer spacers 141 and the inner spacers 142 may include, e.g., at least one of silicon nitride (SiN), silicon oxynitride (SiON), silicon oxide (SiO$_2$), silicon oxycarbide (SiOCN), silicon boron nitride (SiBN), silicon oxyboron nitride (SiOBN), silicon oxycarbide (SiOC), and a combination thereof.

The first gate capping patterns 145 may be disposed on the first gate electrodes 120 and the first gate spacers 140. For example, the upper surfaces of the first gate capping patterns 145 may be placed on the same plane as the upper surfaces of interlayer insulating films 190. In another example, the first gate capping patterns 145 may be disposed between the first gate spacers 140.

The first gate capping patterns 145 may include, e.g., at least one of silicon nitride, silicon oxynitride, silicon carbonitride (SiCN), silicon oxycarbide (SiOCN), and a combination thereof. The first gate capping patterns 145 may include a material having etch selectivity with respect to the interlayer insulating films 190.

The first source/drain patterns 150 may be formed on the first active patterns AP1. The first source/drain patterns 150 may be formed on the first lower pattern BP1. The first source/drain patterns 150 may be connected to the first sheet patterns NS1. The first source/drain patterns 150 may be in contact with the first sheet patterns NS1.

The first source/drain patterns 150 may be disposed on, e.g., opposite, sides of the first gate structures GS1. The first source/drain patterns 150 may be disposed between the first gate structures GS1, which are adjacent to one another in the first direction D1. For example, the first source/drain patterns 150 may be disposed on both sides of each of the first gate structures GS1. In another example, the first source/drain patterns 150 may be disposed on first sides of the first gate structures GS1, but not on second sides of the first gate structures GS1 that are opposite to the first sides of the first gate structures GS1. The first source/drain patterns 150 may be included in the sources/drains of transistors using the first sheet patterns NS1 as channel regions.

The first source/drain patterns 150 may be disposed in first source/drain recesses 150R. The first source/drain recesses 150R may extend in the third direction D3. The bottom surfaces of the first source/drain recesses 150R may be defined by the first lower pattern BP1. Sidewalls of the first source/drain recesses 150R may be defined by the first sheet patterns NS1 and the inner spacers 142. The inner spacers 142 may be disposed between the first inter-gate structures GS1_INT and the first source/drain patterns 150. The first gate insulating films 130 may not be in contact with the first source/drain patterns 150.

The boundaries between the first gate insulating films 130 and the first lower pattern BP1 may correspond to the upper surface BP1_US of the first lower pattern BP1, between the lowermost sheet patterns NS1_LO and the first lower pattern BP1. In other words, referring to FIG. 2, the upper surface BP1_US of the first lower pattern BP1 may correspond to the boundaries between lowermost inter-gate structures GS1_INT and the first lower pattern BP1. In this case, the bottom surfaces of the first source/drain recesses 150R may be lower than the upper surface BP1_US of the first lower pattern BP1.

For example, the width, in the first direction D1, of the first source/drain recesses 150R, which are defined by the first sheet patterns NS1 and the inner spacers 142, may be uniform. In another example, the width, in the first direction D1, of the first source/drain recesses 150R may increase and become uniform away from the upper surface BP1_US of the first lower pattern BP1. In yet another example, the width, in the first direction D1, of the first source/drain recesses 150R, which are defined by the first sheet patterns NS1 and the first gate structures GS1, may increase, become uniform, and decrease away from the first lower pattern BP1.

The first source/drain patterns 150 may include first epitaxial regions 151, second epitaxial regions 152, and third epitaxial regions 153. The first epitaxial regions 151, the second epitaxial regions 152, and the third epitaxial regions 153 may be formed of a semiconductor material. The first epitaxial regions 151, the second epitaxial regions 152, and the third epitaxial regions 153 may be formed as semiconductor material patterns obtained by epitaxial growth. The first epitaxial regions 151, the second epitaxial regions 152, and the third epitaxial regions 153 may include, e.g., Si doped with n-type impurities.

The first epitaxial regions 151 may be in, e.g., direct, contact with the first lower pattern BP1. The first epitaxial regions 151 may extend along the bottom surfaces of the first source/drain recesses 150R.

In the semiconductor device according to some embodiments, the first epitaxial regions 151 may not be in contact with the first sheet patterns NS1. The first epitaxial regions 151 may not be formed at ends of the first sheet patterns NS1. Parts of the first epitaxial regions 151 that are in contact with the first lower pattern BP1, but not with the first sheet patterns NS1 may be, e.g., bottom parts 151B of the first epitaxial regions 151. For example, the first epitaxial regions 151 may be the bottom parts 151B (FIG. 5).

In detail, referring to FIGS. 2 and 5, a thickness t1, in the third direction D3, of the first epitaxial regions 151 may increase and decrease away from the first gate structures GS1. The thickness, in the third direction D3, of the bottom parts 151B of the first epitaxial regions 151 may increase and decrease away from the first gate structures GS1. For example, as illustrated in FIG. 5, the thickness t1 of the bottom parts 151B of the first epitaxial regions 151 may increase as a distance from the inner spacers 142, e.g., from the first gate structures GS1, along the first direction D1 increases, e.g., a maximal thickness t1 may be in a center region of the bottom part 151B at equal distances from two opposite inner spacers 142.

Referring to FIGS. 2 and 5, two first gate structures GS1 adjacent in the first direction D1 may be a first sub-gate structure and a second sub-gate structure. The first epitaxial region 151 may be disposed between the first sub-gate structure GS1 and the second sub-gate structure GS1. The thickness t1 of the first epitaxial region 151 measured while moving from the first sub-gate structure GS1 to the second sub-gate structure GS1 in the first direction D1 may increase and then decrease.

Bottom surfaces 151_BS of the bottom parts 151B of the first epitaxial regions 151 may bulge downwardly toward the first lower pattern BP1. Upper surfaces 151B_US of the bottom parts 151B of the first epitaxial regions 151 may bulge upwardly. For example, the bottom parts 151B of the first epitaxial regions 151 may have a similar shape to a convex lens.

For example, the upper surfaces 151B_US of the bottom parts 151B of the first epitaxial regions 151 may be higher than the upper surface BP1_US of the first lower pattern BP1, e.g., relative to the bottom of the substrate 100. The upper surfaces 151B_US of the bottom parts 151B of the first epitaxial regions 151 may be lower than the bottom surfaces NS1_BS of the lowermost sheet patterns NS1_LO, e.g., relative to the bottom of the substrate 100. The bottom parts 151B of the first epitaxial regions 151 may not cover, e.g., overlap, the sidewalls 142_SW of the lowermost inner spacers 142_LO.

The first epitaxial regions 151 may include Si doped with first n-type impurities. For example, the first n-type impurities may include at least one of antimony (Sb) and bismuth (Bi).

The first n-type impurities may be included in the first epitaxial regions 151 in the amount of about 0.1 at % to about 6 at %. For example, the concentration of the first n-type impurities in the first epitaxial regions 151 may range from 5E19 (/cm$^3$) to 3E21 (/cm$^3$) (e.g., atoms/cm$^3$).

The first epitaxial regions 151 may include doped carbon (C). FIG. 7 illustrates that the carbon concentration of the first epitaxial regions 151 decreases closer to the first lower pattern BP1, but the present disclosure is not limited thereto. Carbon may be included in the first epitaxial regions 151 in the amount of less than 0.3 at %. In other words, the carbon concentration of the first epitaxial regions 151 may be less than 1.5E20 (/cm$^3$).

Referring back to FIGS. 2 and 5, the second epitaxial regions 152 may be formed on the first epitaxial regions 151. The second epitaxial regions 152 may be formed on the bottom parts 151B of the first epitaxial regions 151. The second epitaxial regions 152 may be in contact with the first sheet patterns NS1.

Each of the second epitaxial regions 152 may include a bottom part 152B and sidewall parts 152S. The bottom parts 152B of the second epitaxial regions 152 may extend along the upper surfaces 151B_US of the bottom parts 151B of the first epitaxial regions 151. The bottom parts 152B of the second epitaxial regions 152 may be in, e.g., direct, contact with the bottom parts 151B of the first epitaxial regions 151.

The sidewall parts 152S of each of the second epitaxial regions 152 may be formed at ends of the first sheet patterns NS1 that define the first source/drain recesses 150R. The sidewall parts 152S of each of the second epitaxial regions 152 may be in, e.g., direct, contact with the first sheet patterns NS1. The sidewall parts 152S of each of the second epitaxial regions 152 may generally cover, e.g., overlap, sidewalls of the first sheet patterns NS1 that define the sidewalls of the first source/drain recesses 150R. For example, the bottom part 152B of each of the second epitaxial regions 152, may not be in contact with the sidewall parts 152S of each of the second epitaxial regions 152.

Referring to FIG. 6, a thickness t21, in the first direction D1, of the sidewall parts 152S of each of the second epitaxial regions 152 may be smaller than a thickness t22, in the third direction D3, of the sidewall parts 152S of each of the second epitaxial regions 152.

Sidewall parts 152S of each of the second epitaxial regions 152 that are in contact with the first sheet patterns NS1 may be spaced apart from one another. In a case where the first sheet patterns NS1 include lower and upper sheet patterns NS1 that are adjacent to each other in the third direction D3, sidewall parts 152S of the second epitaxial regions 152 that are in contact with the lower sheet patterns NS1 may not be in contact with sidewall parts 152S of the second epitaxial regions 152 that are in contact with the upper sheet patterns NS1. For example, referring to FIG. 2, sidewall parts 152S that are adjacent to each other along the third direction D3 may be spaced apart from each other and may not contact each other.

As illustrated in FIG. 5, the bottom parts 152B of the second epitaxial regions 152 may cover, e.g., overlap, parts of the sidewalls 142_SW of the lowermost inner spacers 142_LO. The bottom parts 152B of the second epitaxial regions 152 may cover, e.g., overlap, first edges EDGE1 between the lowermost inner spacers 142_LO and the first lower pattern BP1.

As illustrated in FIG. 6, the sidewall parts 152S of each of the second epitaxial regions 152 may cover, e.g., overlap, parts of the sidewalls 142_SW of the inner spacers 142. The sidewall parts 152S of each of the second epitaxial regions 152 may, e.g., partially, extend along the sidewalls 142_SW of the inner spacers 142. The sidewall parts 152S of each of the second epitaxial regions 152 may cover, e.g., overlap, second edges EDGE2 between the inner spacers 142 and the first sheet patterns NS1.

First sub-inner spacers may be disposed above the first sheet patterns NS1, and second sub-inner spacers may be disposed below the first sheet patterns NS1. The first sub-inner spacers and the second sub-inner spacers may be in contact with the first sheet patterns NS1. The sidewall parts 152S of each of the second epitaxial regions 152 may cover parts of the sidewalls of the first sub-inner spacers and parts of the sidewalls of the second sub-inner spacers.

The sidewalls 142_SW of the lowermost inner spacers 142_LO may include parts that are covered by the bottom parts 152B of the second epitaxial regions 152, parts that are covered by the sidewall parts 152S of the second epitaxial regions 152, and parts that are not covered by the second epitaxial regions 152.

The second epitaxial regions 152 may include Si doped with a second n-type impurities. The second n-type impurities may differ from the first n-type impurities. For example, the second n-type impurities may include As. The second n-type impurities may be included in the second epitaxial regions 152 in the amount of about 0.2 at % to about 4 at %. For example, the concentration of the second n-type impurities in the second epitaxial regions 152 may range from 1E20 (/cm$^3$) to 2E21 (/cm$^3$).

The second epitaxial regions 152 may include doped carbon. Carbon may be included in the second epitaxial regions 152 in the amount of less than 0.3 at %. In other words, the carbon concentration of the second epitaxial regions 152 may be less than 1.5E20 (/cm$^3$).

Referring to FIG. 2, the third epitaxial regions 153 may be formed on the first epitaxial regions 151 and the second epitaxial regions 152. The third epitaxial regions 153 may connect the bottom part 152B of each of the second epitaxial regions 152 and the sidewall parts 152S of each of the second epitaxial regions 152, which are spaced apart from the bottom part 152B of each of the second epitaxial regions 152. The third epitaxial regions 153 may also connect the sidewall parts 152S of each of the second epitaxial regions 152, which are spaced apart from one another. The third epitaxial regions 153 may be in contact with the first epitaxial regions 151 and the second epitaxial regions 152. The bottom parts 152B of the second epitaxial regions 152 may be disposed between the bottom parts 151B of the first epitaxial regions 151 and the third epitaxial regions 153.

The third epitaxial regions 153 may cover the parts of the inner sidewalls 142_SW of the inner spacers 142 that are not covered by the second epitaxial regions 152.

Referring to FIG. 2, the third epitaxial regions 153 may protrude beyond the upper surface AP1_US of the first active pattern AP1 by a first height H. The upper surface AP1_US of the first active pattern AP1 may be the upper surfaces NS1_US of the first sheet pattern disposed on the top of first sheet patterns NS1. The first height H may be, e.g., about nm 0 to about 10 nm.

The third epitaxial regions 153 may include Si doped with a third n-type impurities. The third n-type impurities may differ from the first n-type impurities and the second n-type impurities. For example, the third n-type impurities may include phosphorus (P). The third n-type impurities may be included in the third epitaxial regions 153 in the amount of about 4 at % to about 12 at %. For example, the concentration of the third n-type impurities in the third epitaxial regions 153 may range from 2E20 (/cm$^3$) to 6E21 (/cm$^3$).

As phosphorus (P) has a large diffusion coefficient in silicon (Si), the phosphorus (P) in the first source/drain patterns 150 may potentially diffuse into parts of the first lower pattern BP1 that overlap with the first gate structures GS1 in the third direction D3. For example, the first edges EDGE1 between the lowermost inner spacers 142_LO and the first lower pattern BP1 may become easy paths for phosphorus (P) to diffuse. Due to phosphorus (P) diffusing into parts of the first lower pattern BP1 below the first gate structures GS1, leakage currents may be generated during the operation of the semiconductor device according to some embodiments of the present disclosure.

However, according to example embodiments, the first epitaxial regions 151 may be disposed between the third epitaxial regions 153, which are doped with phosphorus (P), and the first lower pattern BP1. As the first epitaxial regions 151 are provided, the length of paths for the diffusion of phosphorus (P) into the first lower pattern BP1 may increase, e.g., phosphorus (P) may diffuse from the third epitaxial region 153 to both the lowermost inner spacers 142_LO and the first epitaxial region 151 before the first lower pattern BP1. Also, since the first epitaxial regions 151 are doped with heavy metals, i.e., Sb or Bi, that have a smaller diffusion coefficient in silicon (Si), as compared to phosphorus (P), even if Sb or Bi were to diffuse into the first lower pattern BP1, the Sb or Bi would diffuse into a very small region in the first lower pattern BP1, and thus, leakage currents would not increase. Accordingly, the use of the first epitaxial regions 151 can reduce leakage currents in the semiconductor device according to some embodiments of the present disclosure. Therefore, the reliability of the semiconductor device according to some embodiments of the present disclosure may be improved.

Further, as the second epitaxial regions 152 cover the first edges EDGE1 between the lowermost inner spacers 142_LO and the first lower pattern BP1, the length of paths for the diffusion of phosphorus (P) into the first lower pattern BP1 may increase, e.g., phosphorus (P) may diffuse from the third epitaxial region 153 to the lowermost inner spacers 142_LO and the first and second epitaxial regions 151 and 152 before the first lower pattern BP1. As the second epitaxial regions 152 cover the second edges EDGE2 between the inner spacers 142 and the first sheet patterns NS1, the number of paths for the diffusion of phosphorus (P) into the first sheet patterns NS1 may increase, e.g., the position of the second epitaxial region 152 may minimize diffusion between the third epitaxial region 153 and the first sheet patterns NS1. That is, since the second epitaxial regions 152 cover the first edges EDGE1 and the second edges EDGE2, phosphorus (P) can be prevented from diffusing excessively into the first sheet patterns NS1. Further, as the second epitaxial regions 152 are doped with arsenic (As) that has a smaller diffusion coefficient in silicon (Si) than phosphorus (P), arsenic (As) in the second epitaxial regions 152 may exhibit a similar effect to Sb or Bi in the first epitaxial regions 151, e.g., arsenic (As) may diffuse into very small areas without increasing leakage currents.

FIG. 4 illustrates that the first source/drain patterns 150 have a rectangular shape in a cross-sectional view, but the present disclosure is not limited thereto. The sidewalls and the upper surfaces of the first source/drain patterns 150 are illustrated as being rectilinear, but the present disclosure is not limited thereto.

Referring to FIGS. 2 and 4, etch stopper films 185 may be disposed on the upper surface of the field insulating film 105, the sidewalls of the first gate structures GS1, the upper surfaces of the first source/drain patterns 150, and the sidewalls of the first source/drain patterns 150. The etch stopper films 185 may include a material having etch selectivity with respect to the interlayer insulating films 190 that will be described later. The etch stopper films 185 may include at least one of, e.g., SiN, SiON, SiOCN, SiBN, SiOBN, SiOC, and a combination thereof.

The interlayer insulating films 190 may be disposed on the etch stopper films 185. The interlayer insulating films 190 may be disposed on the field insulating film 105 and the first source/drain patterns 150. The interlayer insulating films 190 may not cover the upper surfaces of the first gate capping patterns 145. For example, the upper surfaces of the interlayer insulating films 190 may be placed on the same plane as the upper surfaces of the first gate capping patterns 145.

The interlayer insulating films 190 may include, e.g., at least one of silicon oxide, silicon nitride, silicon oxynitride, and a low-k material. The low-k material may include, e.g., fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen Silazen (TOSZ), fluoride silicate glass (FSG), polyimide nanofoam, e.g., polypropylene oxide, carbon-doped silicon oxide (CDO), organo-silicate glass (OSG), SiLK, amorphous fluorinated carbon, silica aerogel, silica xerogel, mesoporous silica, or a combination thereof, but the present disclosure is not limited thereto.

Figure 8:
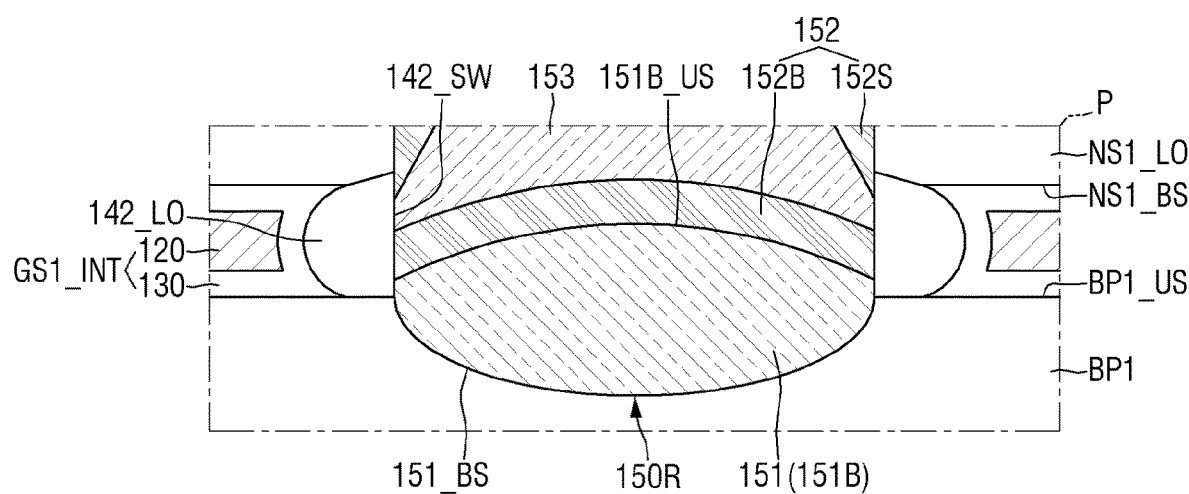
FIG. 8 is a partial view of a semiconductor device according to some embodiments of the present disclosure.
Figure 9:
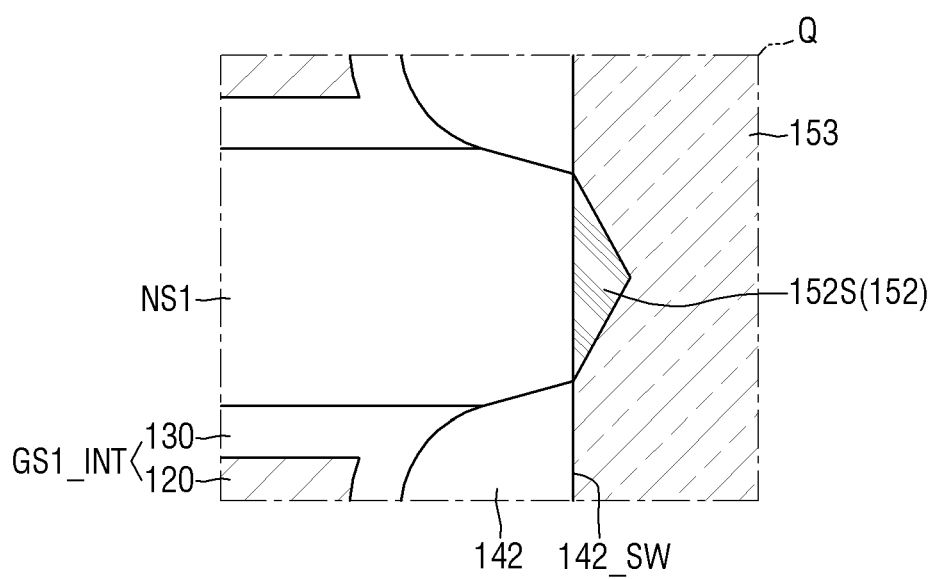
FIG. 9 is a partial view of a semiconductor device according to some embodiments of the present disclosure.

FIG. 8 is a diagram for explaining a semiconductor device according to some embodiments of the present disclosure. FIG. 9 is a diagram for explaining a semiconductor device according to some embodiments of the present disclosure. For convenience, the embodiment of FIGS. 8 and 9 will hereinafter be described, focusing mainly on the differences relative to the embodiment of FIGS. 1 through 7. Specifically, FIGS. 8 and 9 are enlarged cross-sectional views of parts P and Q, respectively, of FIG. 2 of a semiconductor device according to some embodiments of the present disclosure.

Referring to FIG. 8, in the semiconductor device according to some embodiments, the bottom part 151B of the first epitaxial region 151 may cover, e.g., overlap, a part of the sidewall 142_SW of the lowermost inner spacer 142_LO (e.g., rather than being at a completely lower level below the sidewall 142_SW).

The sidewall 142_SW of the lowermost inner spacer 142_LO may include a part that is covered, e.g., overlapped, by the bottom part 151B of the first epitaxial region 151, a part that is covered, e.g., overlapped, by the bottom part 152B of the second epitaxial region 152, a part that is covered, e.g., overlapped, by a sidewall part 152S of the second epitaxial region 152, and a part that is not covered, e.g., overlapped, by the second epitaxial region 152.

As the bottom part 151B of the first epitaxial region 151 covers a part of the sidewall 142_SW of the lowermost inner spacer 142_LO, the length of paths for the diffusion of phosphorus (P), included in the third epitaxial region 153, into the first lower pattern BP1 may further increase, e.g., phosphorus (P) may be required to diffuse through additional layers/distance before reaching the first lower pattern BP1. Thus, leakage currents that may be generated by the first lower pattern BP1 can be further reduced.

Referring to FIG. 9, in the semiconductor device according to some embodiments, the sidewall part 152S of the second epitaxial region 152 may not cover the sidewall 142_SW of the inner spacer 142. The sidewall part 152S of the second epitaxial region 152 may not extend along the sidewall 142_SW of the inner spacer 142.

Figure 10:
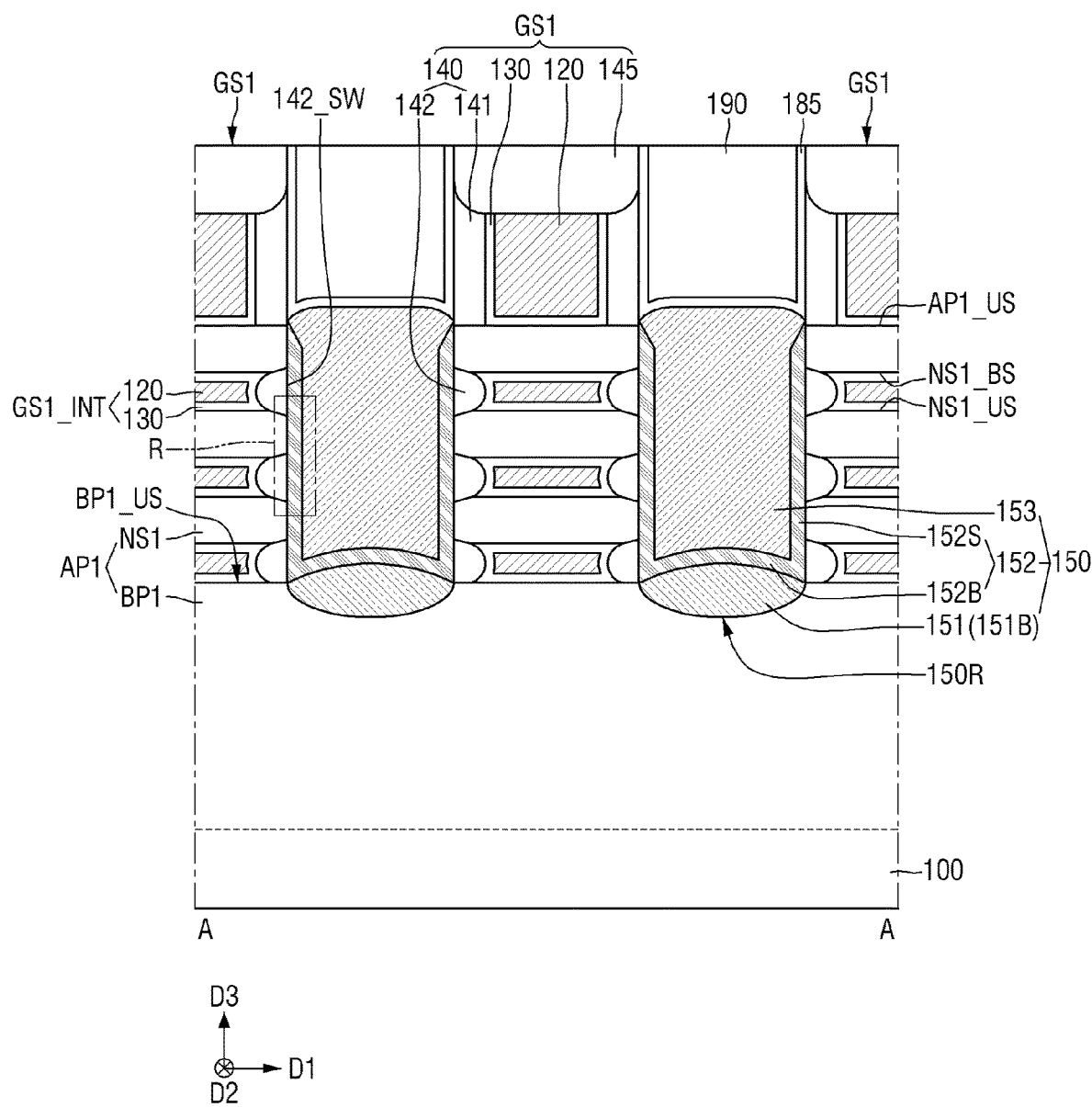
FIG. 10 is a cross-sectional view of a semiconductor device according to some embodiments of the present disclosure.
Figure 11:
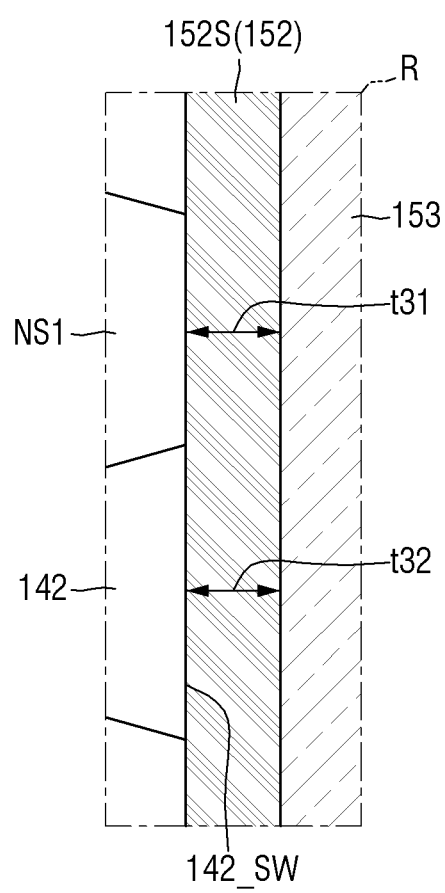
FIGS. 11 and 12 are enlarged cross-sectional views of part R of FIG. 10.
Figure 12:
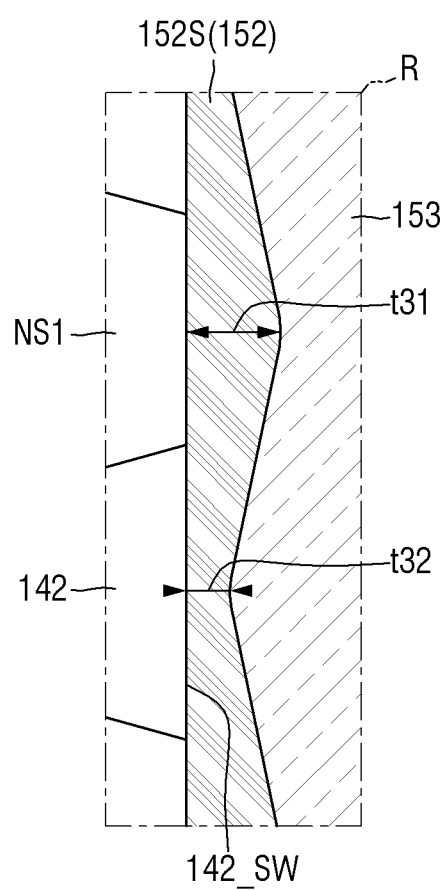

FIG. 10 is a diagram of a semiconductor device according to some embodiments of the present disclosure. FIGS. 11 and 12 are enlarged cross-sectional views of part R of FIG. 10. For convenience, the embodiment of FIGS. 10 through 12 will hereinafter be described, focusing mainly on the differences relative to the embodiment of FIGS. 1 through 7.

Referring to FIGS. 10 through 12, in the semiconductor device according to some embodiments, the second epitaxial regions 152 may be formed continuously along the upper surfaces of bottom parts 151B of the first epitaxial regions 151, the inner spacers 142, and the first sheet patterns NS1.

The second epitaxial regions 152 may be formed continuously along sidewalls of first source/drain recesses 150R. Bottom parts 152B of the second epitaxial regions 152 may extend along the upper surfaces of the bottom parts 151B of the first epitaxial regions 151. Sidewall parts 152S of each of the second epitaxial regions 152 may extend along sidewalls 142_SW of the inner spacers 142 and sidewalls of the first sheet patterns NS1. The bottom parts 152B of the second epitaxial regions 152 may be directly connected to the sidewall parts 152S of each of the second epitaxial regions 152.

The second epitaxial regions 152 generally cover the upper surfaces of the bottom parts 151B of the first epitaxial regions 151, sidewalls 142_SW of lowermost inner spacers 142, and sidewalls of lowermost first sheet patterns NS1. The sidewall parts 152S of each of the second epitaxial regions 152 may generally cover the sidewalls 142_SW of the inner spacers 142.

Referring to FIG. 11, a thickness t31 of the sidewall parts 152S of each of the second epitaxial regions 152 on the sidewalls of the first sheet patterns NS1 may be the same as a thickness t32 of the sidewall parts 152S of each of the second epitaxial regions 152 on the sidewalls 142_SW of the inner spacers 142. For example, the thickness t32 of the second epitaxial regions 152 on the sidewalls 142_SW of the inner spacers 142 may be the thickness of the sidewalls 142_SW of the inner spacers 142, measured from the midpoints, in the third direction D3, of the inner spacers 142.

Referring to FIG. 12, the thickness t31 of the sidewall parts 152S of each of the second epitaxial regions 152 on the sidewalls of the first sheet patterns NS1 may be greater than the thickness t32 of the sidewall parts 152S of each of the second epitaxial regions 152 on the sidewalls 142_SW of the inner spacers 142.

Figure 13:
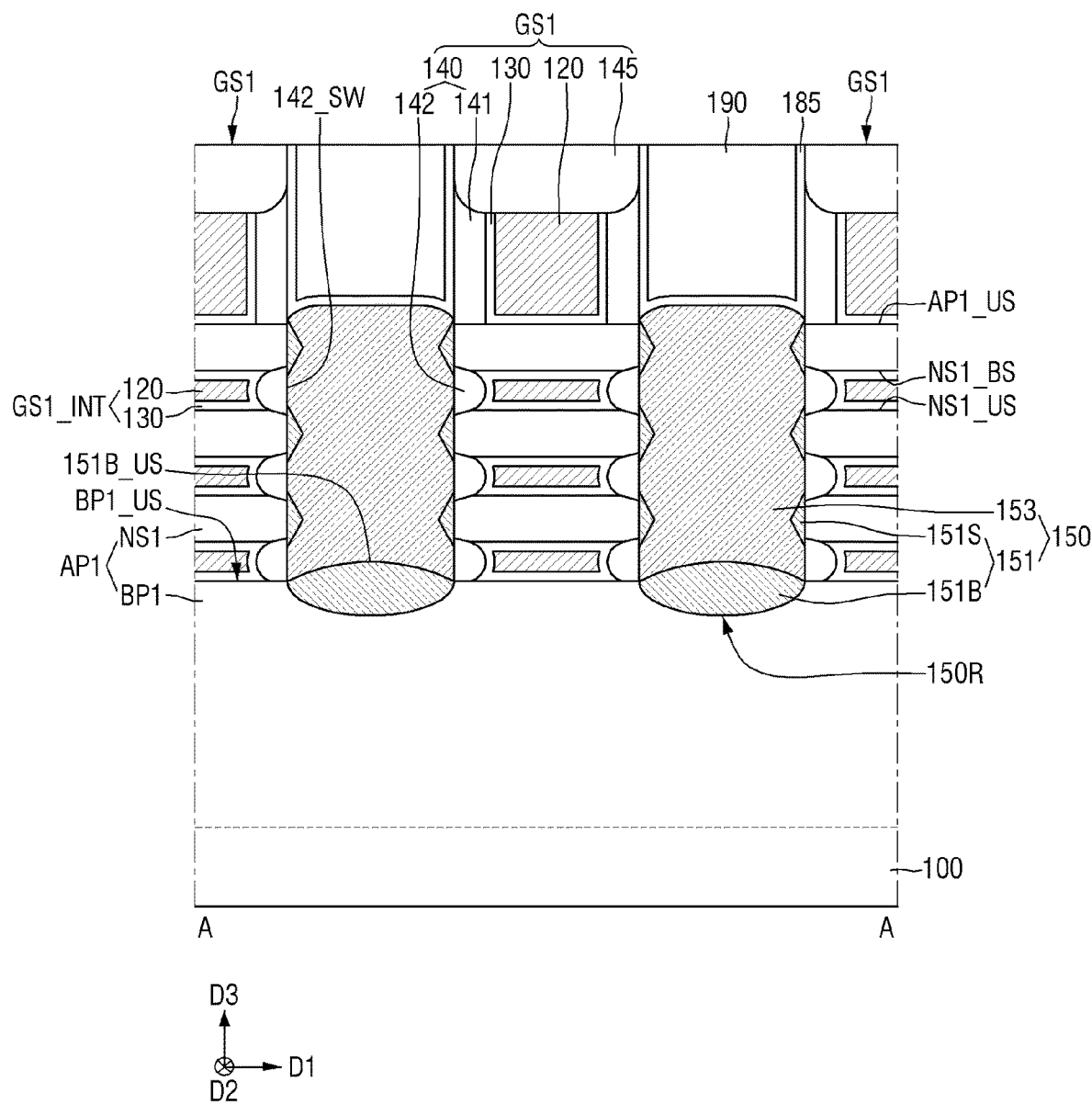
FIG. 13 is a cross-sectional view of a semiconductor device according to some embodiments of the present disclosure.
Figure 14:
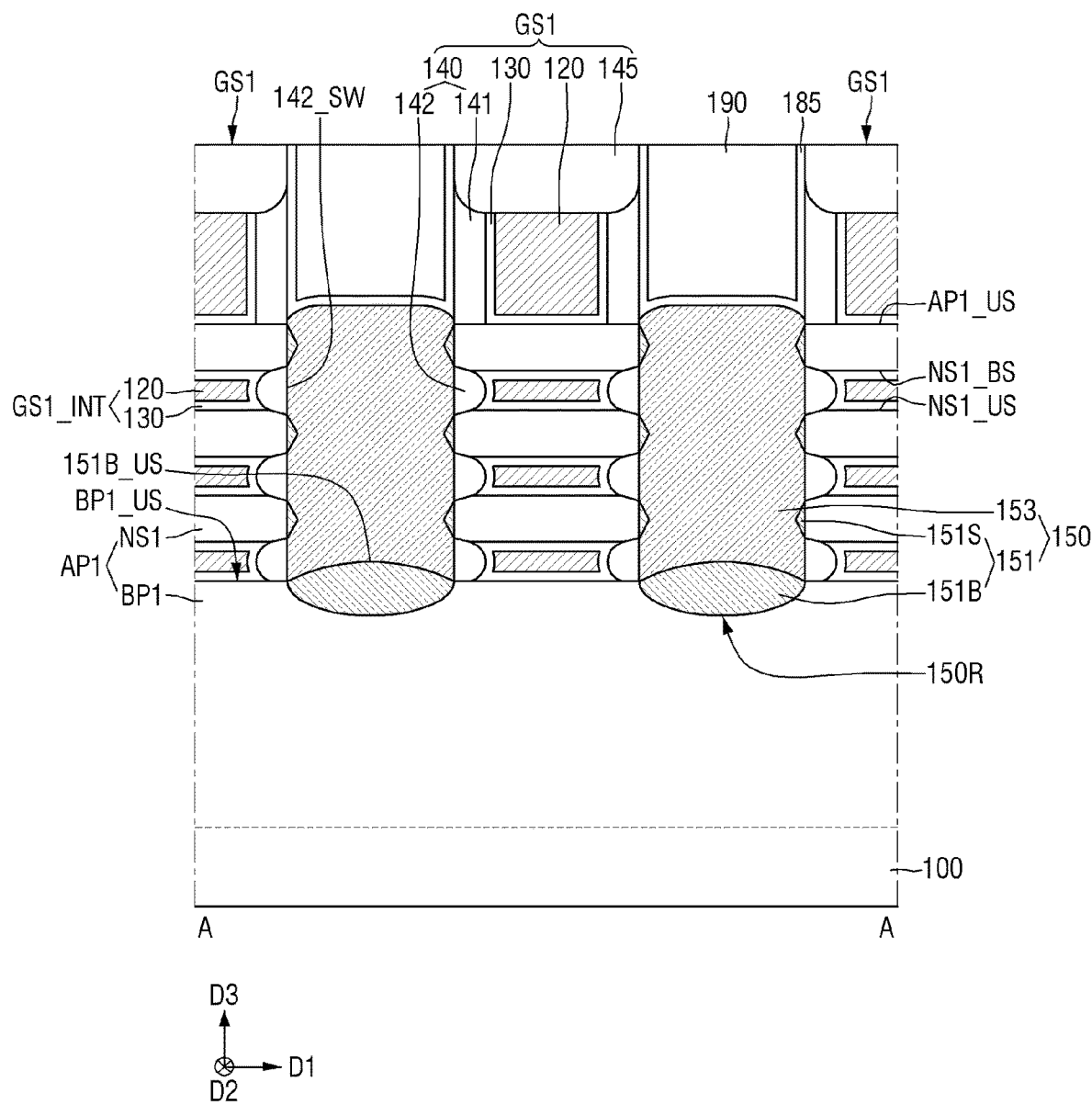
FIG. 14 is a cross-sectional view of a semiconductor device according to some embodiments of the present disclosure.

FIG. 13 is a diagram of a semiconductor device according to some embodiments of the present disclosure. FIG. 14 is a diagram of a semiconductor device according to some embodiments of the present disclosure. The embodiments of FIGS. 13 and 14 will hereinafter be described, focusing mainly on the differences relative to the embodiment of FIGS. 1 through 7.

Referring to FIGS. 13 and 14, in the semiconductor device according to some embodiments, the first epitaxial regions 151 may be in contact with first sheet patterns NS1. First source/drain patterns 150 include the first epitaxial regions 151 and third epitaxial regions 153, but do not include second epitaxial regions (152 of FIG. 2).

Each of the first epitaxial regions 151 may include the bottom part 151B and sidewall parts 151S. The sidewall parts 151S of each of the first epitaxial regions 151 may be formed at ends of the first sheet patterns NS1 that define the first source/drain recesses 150R. The sidewall parts 151S of each of the first epitaxial regions 151 may be in contact with the first sheet patterns NS1. For example, the bottom part 151B of each of the first epitaxial regions 151 may not be in contact with the sidewall parts 151S of each of the first epitaxial regions 151.

In the embodiments of FIGS. 13 and 14, like in the embodiment of FIG. 6, the thickness, in the first direction D1, of the sidewall parts 151S of each of the first epitaxial regions 151 is smaller than the thickness, in the third direction D3, of the sidewall parts 151S of each of the first epitaxial regions 151.

The third epitaxial regions 153 may be formed directly on the first epitaxial regions 151. The third epitaxial regions 153 may be in contact with the first epitaxial regions 151. The third epitaxial regions 153 may be in contact with the bottom part 151B and the sidewall parts 151S of each of the first epitaxial regions 151. The third epitaxial regions 153 may connect the bottom part 151B and the sidewall parts 151S of each of the first epitaxial regions 151.

The bottom part 151B of each of the first epitaxial regions 151 is illustrated as not covering sidewalls 142_SW of inner spacers 142, but the present disclosure is not limited thereto. Alternatively, the bottom part 151B of each of the first epitaxial regions 151 may cover parts of the sidewalls 142_SW of lowermost inner spacers 142.

Referring to FIG. 13, the sidewall parts 151S of each of the first epitaxial regions 151 may cover parts of the sidewalls 142_SW of the lowermost inner spacers 142. The sidewall parts 151S of each of the first epitaxial regions 151 may extend along parts of the sidewalls 142_SW of lowermost inner spacers 142. The sidewall parts 151S of each of the first epitaxial regions 151 may cover the boundaries between the inner spacers 142 and the first sheet patterns NS1.

Referring to FIG. 14, the sidewall parts 151S of each of the first epitaxial regions 151 may not cover the sidewalls 142_SW of the inner spacers 142.

Figure 15:
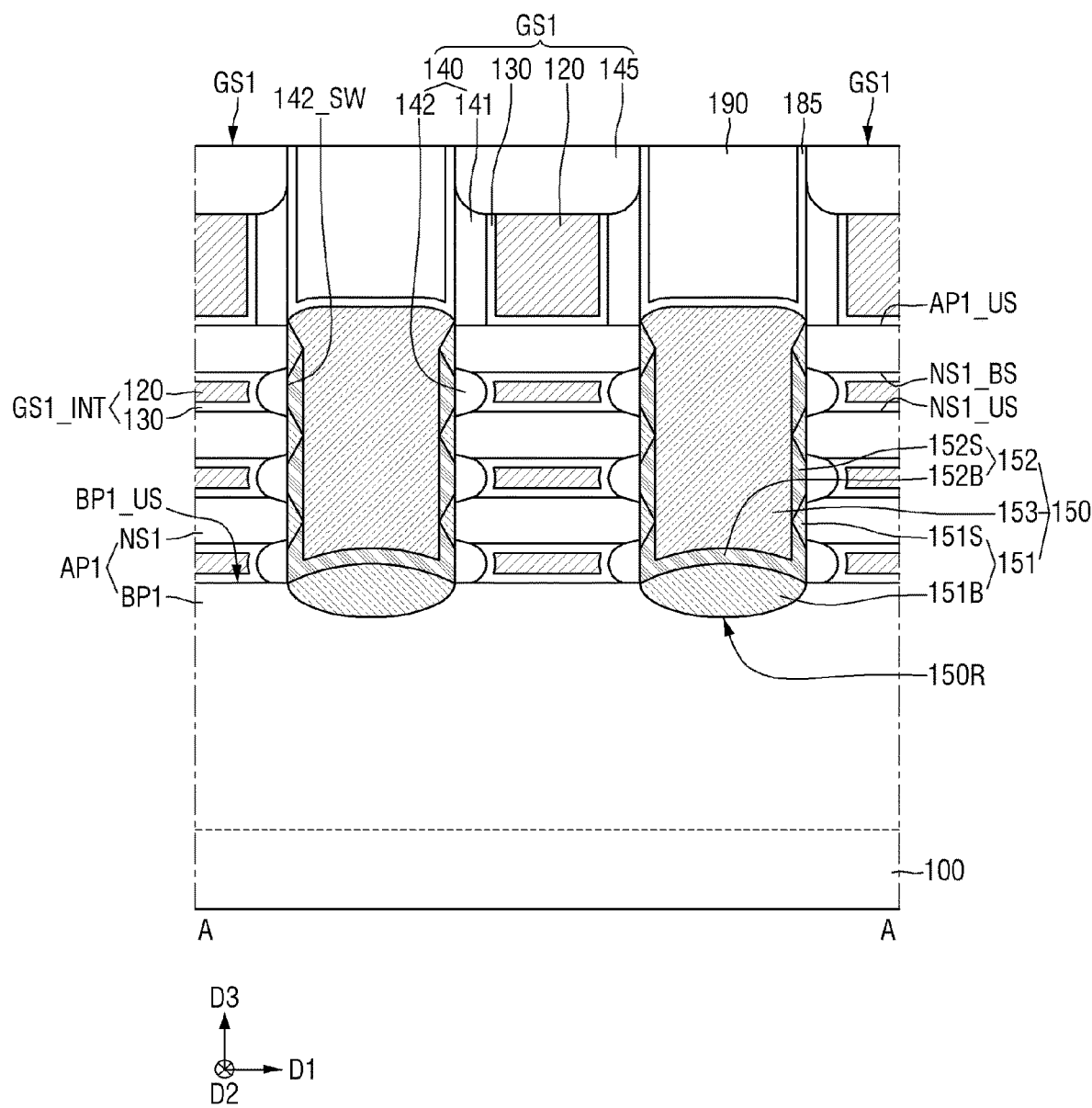
FIG. 15 is a cross-sectional view of a semiconductor device according to some embodiments of the present disclosure.

FIG. 15 is a diagram of a semiconductor device according to some embodiments of the present disclosure. For convenience, the embodiment of FIG. 15 will hereinafter be described, focusing mainly on the differences relative to the embodiment of FIG. 13.

Referring to FIG. 15, in the semiconductor device according to some embodiments, the first source/drain patterns 150 may further include the second epitaxial regions 152.

The second epitaxial regions 152 may connect the bottom part 151B the sidewall parts 151S of each of first epitaxial regions 151. The second epitaxial regions 152 may also connect the sidewall parts 151S of each of the first epitaxial regions 151, which are adjacent to one another in the third direction D3.

Each of the second epitaxial regions 152 may include the bottom part 152B and the sidewall parts 152S. The bottom part 152B of each of the second epitaxial regions 152 may extend along the upper surface of the bottom part 151B of each of the first epitaxial regions 151. The sidewall parts 152S of each of the second epitaxial regions 152 may extend along the sidewalls 142_SW of inner spacers 142.

The sidewall parts 151S of each of the first epitaxial regions 151 may include first and second sidewall parts that are spaced apart from each other in the third direction D3. The sidewall parts 152S of each of the second epitaxial regions 152 may connect first and second sidewall parts of each of the first epitaxial regions 151. The sidewall parts 152S of each of the second epitaxial regions 152 may be in contact with the first and second sidewall parts of each of the first epitaxial regions 151.

Parts of the sidewall parts 152S of each of the second epitaxial regions 152 and the bottom part 152B of each of the second epitaxial regions 152 may connect the sidewall parts 151S and the bottom part 151B of each of the first epitaxial regions 151.

Figure 16:
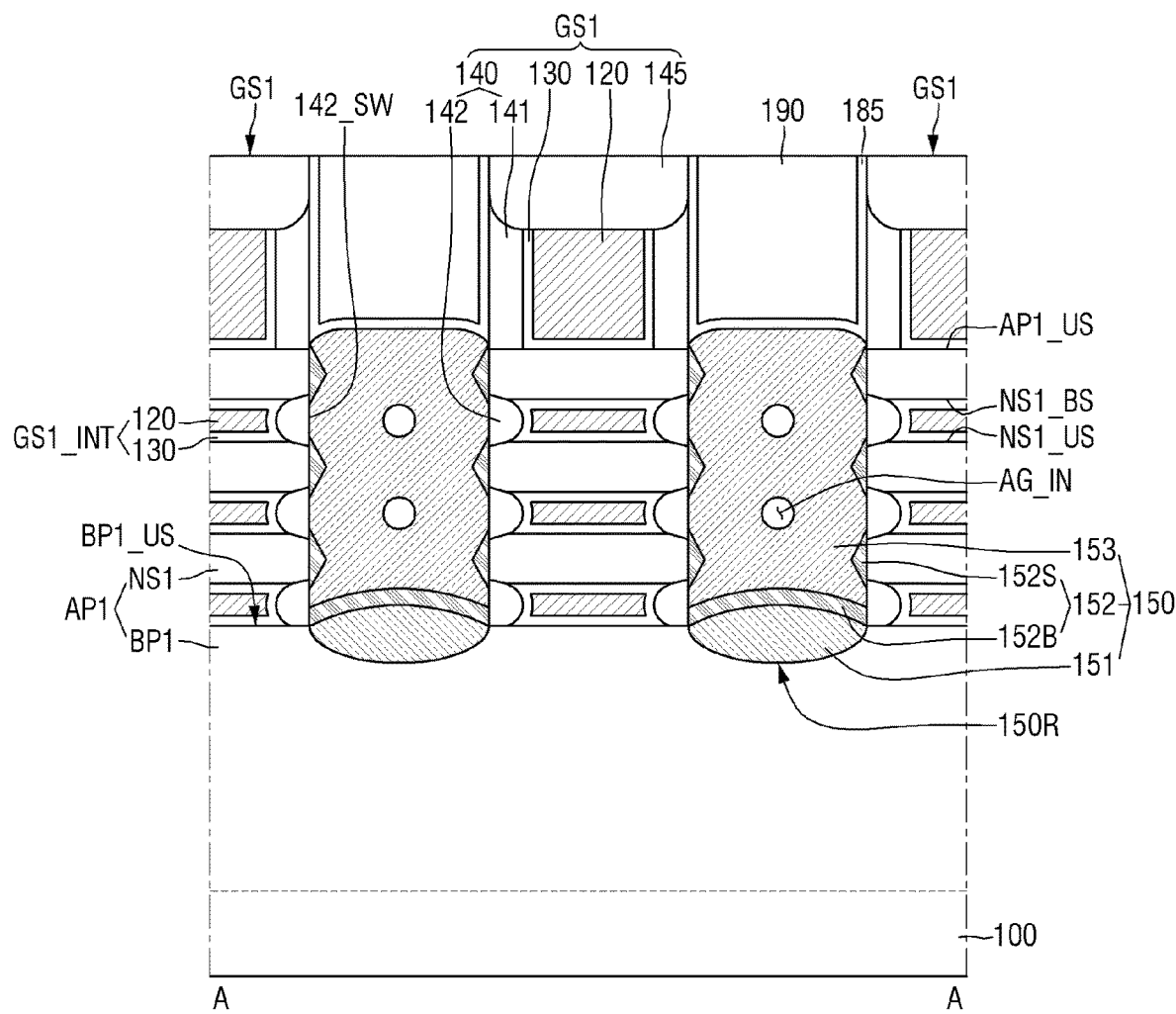
FIG. 16 is a cross-sectional view of a semiconductor device according to some embodiments of the present disclosure.
Figure 17:
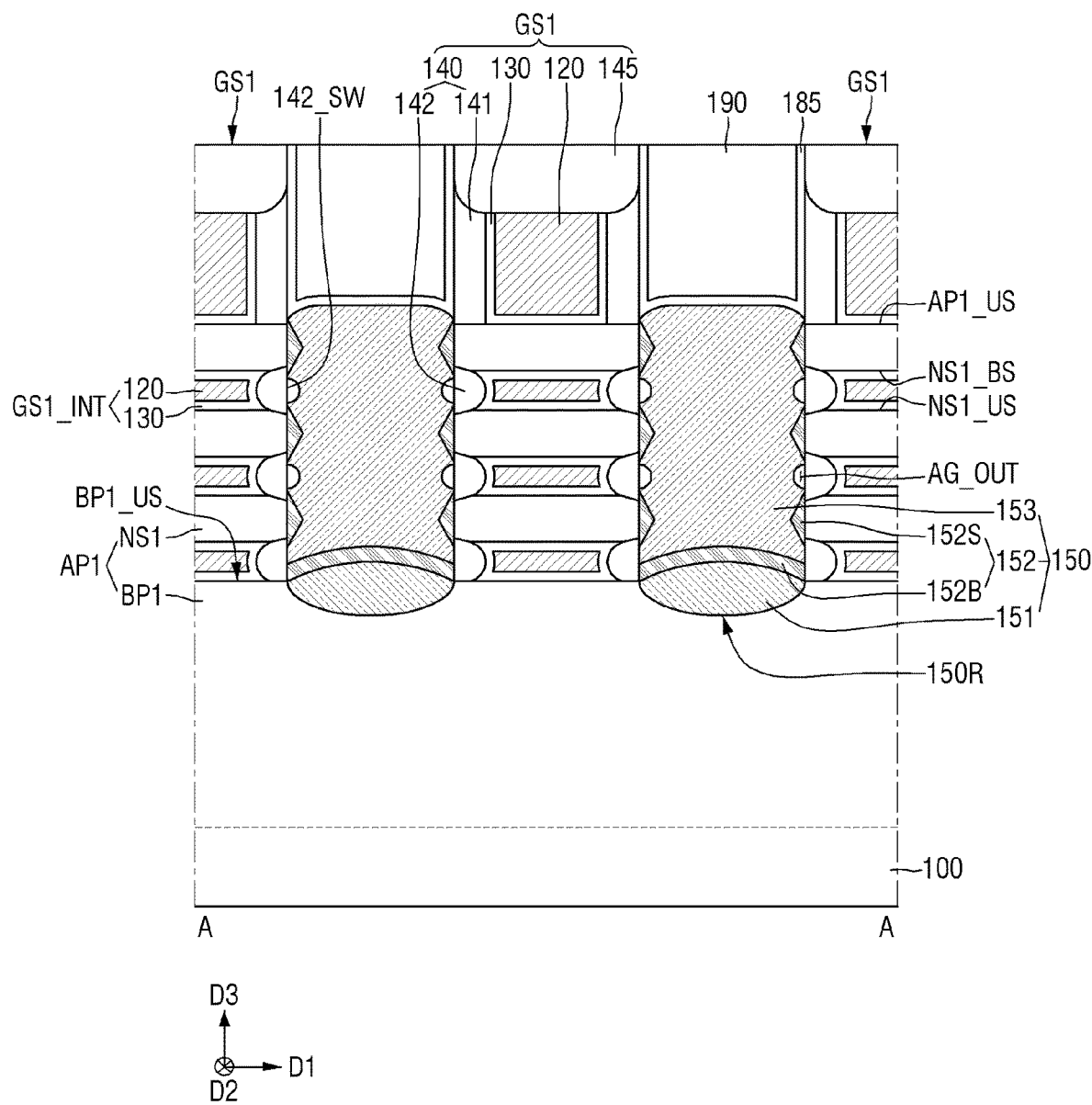
FIG. 17 is a cross-sectional view of a semiconductor device according to some embodiments of the present disclosure.
Figure 18:
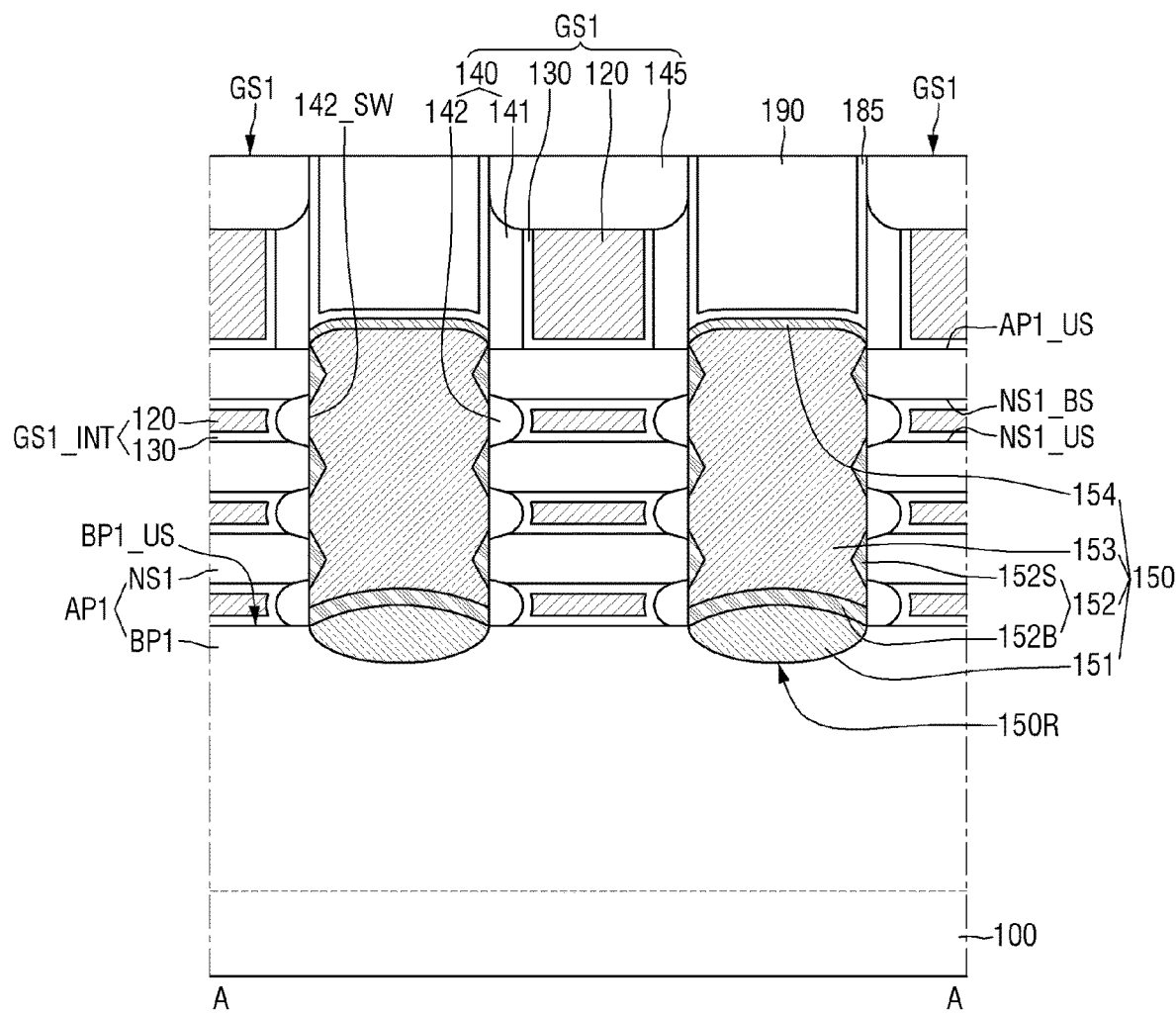
FIG. 18 is a cross-sectional view of a semiconductor device according to some embodiments of the present disclosure.
Figure 19:
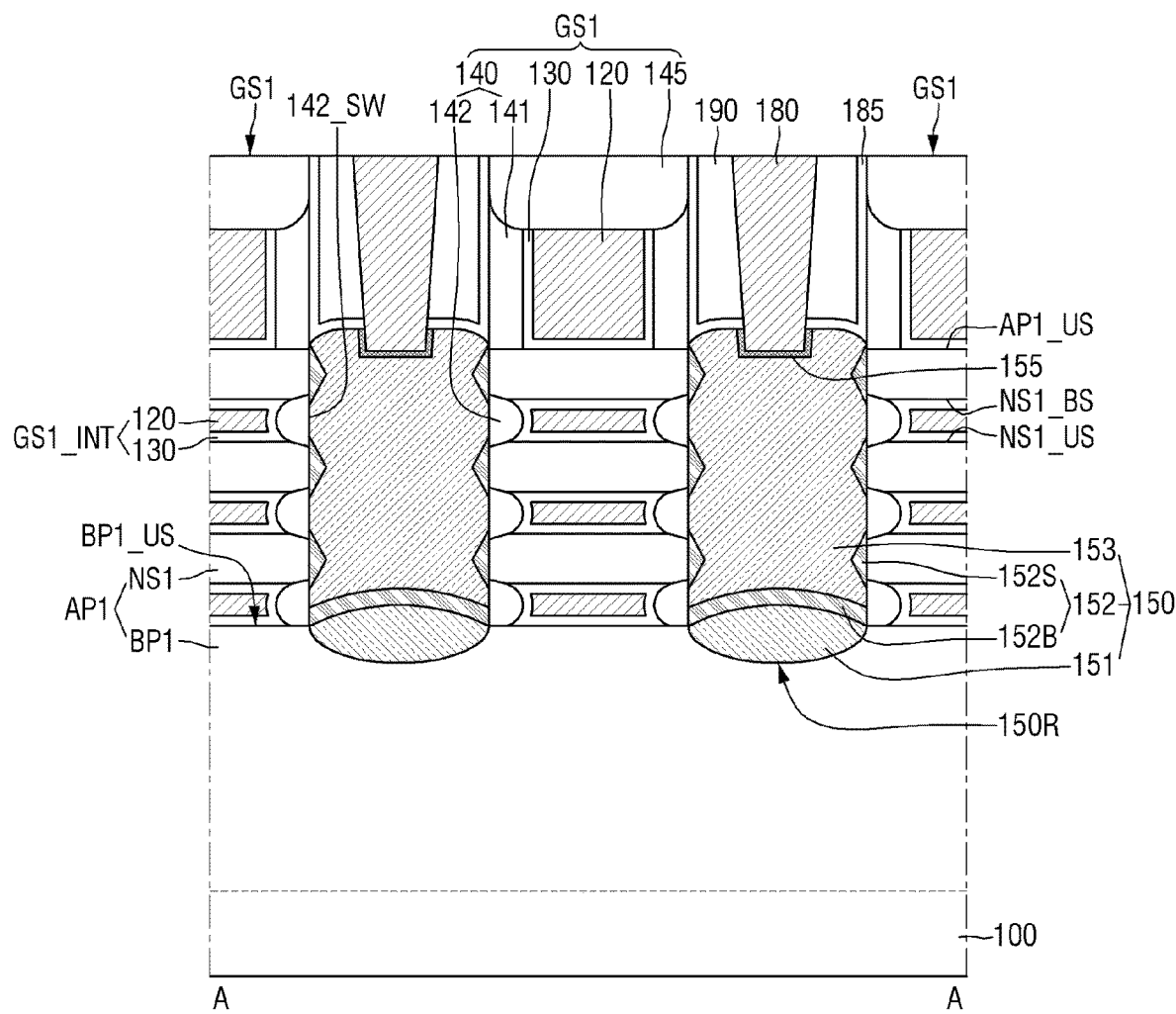
FIG. 19 is a cross-sectional view of a semiconductor device according to some embodiments of the present disclosure.

FIG. 16 is a diagram of a semiconductor device according to some embodiments of the present disclosure. FIG. 17 is a diagram of a semiconductor device according to some embodiments of the present disclosure. FIG. 18 is a diagram of a semiconductor device according to some embodiments of the present disclosure. FIG. 19 is a diagram of a semiconductor device according to some embodiments of the present disclosure. For convenience, the embodiments of FIGS. 16 through 19 will hereinafter be described, focusing mainly on the differences relative to the embodiment of FIGS. 1 through 7.

Referring to FIG. 16, in the semiconductor device according to some embodiments, the first source/drain patterns 150 may include inner airgaps AG_IN. The inner airgaps AG_IN may be disposed in the third epitaxial regions 153. The third epitaxial regions 153 may generally surround the inner airgaps AG_IN. A semiconductor material included in the third epitaxial regions 153 may generally surround the inner airgaps AG_IN.

First inter-gate structures GS1_INT, which are disposed between first sheet patterns NS1 that are adjacent to one another in the third direction D3, may overlap with the inner air gaps AG_IN in the first direction D1. The inner airgaps AG_IN may overlap with the inner spacers 142 in the first direction D1. The inner airgaps AG_IN may not be in contact with the inner spacers 142.

Referring to FIG. 17, the semiconductor device according to some embodiments of the present disclosure may further include outer airgaps AG_OUT, which are disposed between the inner spacers 142 and the first source/drain patterns 150. The outer airgaps AG_OUT may be surrounded by the inner spacers 142 and the first source/drain patterns 150. The outer airgaps AG_OUT may be surrounded by the inner spacers 142 and third epitaxial regions 153. In a case where second epitaxial regions 152 are disposed on sidewalls 142_SW of the inner spacers 142, as illustrated in FIGS. 9 and 15, the outer airgaps AG_OUT may be surrounded by the inner spacers 142 and the second epitaxial regions 152.

The outer airgaps AG_OUT may be in contact with the inner spacers 142. The outer airgaps AG_OUT may be surrounded by the surfaces of the inner spacers 142 and a semiconductor material included in the first source/drain patterns 150. Alternatively, the outer airgaps AG_OUT may be disposed between some of the inner spacers 142 and the first source/drain patterns 150.

Referring to FIG. 18, in the semiconductor device according to some embodiments, the first source/drain patterns 150 may further include capping epitaxial semiconductor regions 154, which are formed on the third epitaxial regions 153. The capping epitaxial semiconductor regions 154 may include Si.

For example, the capping epitaxial semiconductor regions 154 may include undoped Si. Here, the term "undoped Si" refers to Si not including intentionally doped impurities, rather than Si not including impurities. In another example, the capping epitaxial semiconductor regions 154 may include Si doped with n-type impurities. The n-type impurity concentration of the capping epitaxial semiconductor regions 154 may be lower than the n-type impurity concentration of the third epitaxial regions 153.

Referring to FIG. 19, the semiconductor device according to some embodiments of the present disclosure may further include source/drain contacts 180, which are disposed on the first source/drain patterns 150. The source/drain contacts 180 may be connected to the first source/drain patterns 150. The source/drain contacts 180 may be connected to the first source/drain patterns 150 through the interlayer insulating films 190 and the etch stopper films 185.

Metal silicide films 155 may be further disposed between the source/drain contacts 180 and the first source/drain patterns 150. The bottom surfaces of the source/drain contacts 180 are illustrated as being higher than the bottom surfaces of uppermost first sheet patterns NS1, but the present disclosure is not limited thereto. Alternatively, the bottom surfaces of the source/drain contacts 180 may be located between the bottom surfaces of lowermost first sheet patterns NS1 and the bottom surfaces of the uppermost first sheet patterns NS1.

The source/drain contacts 180 are illustrated as being single-layer films, but the present disclosure is not limited thereto. The source/drain contacts 180 may include at least one of, e.g., a metal, a metal alloy, a conductive metal nitride, a conductive metal carbide, a conductive metal oxide, a conductive metal carbonitride, and a 2D material. The metal silicide films 155 may include a metal silicide.

Figure 20:
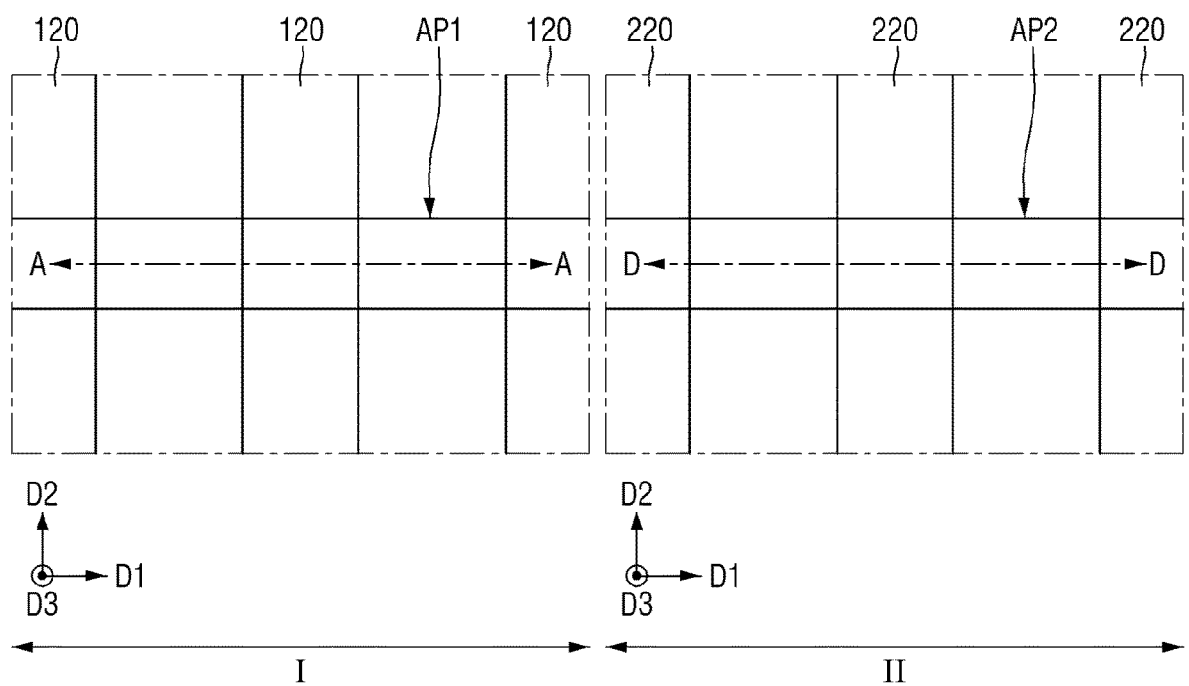
FIG. 20 is a layout view of a semiconductor device according to some embodiments of the present disclosure.
Figure 21:
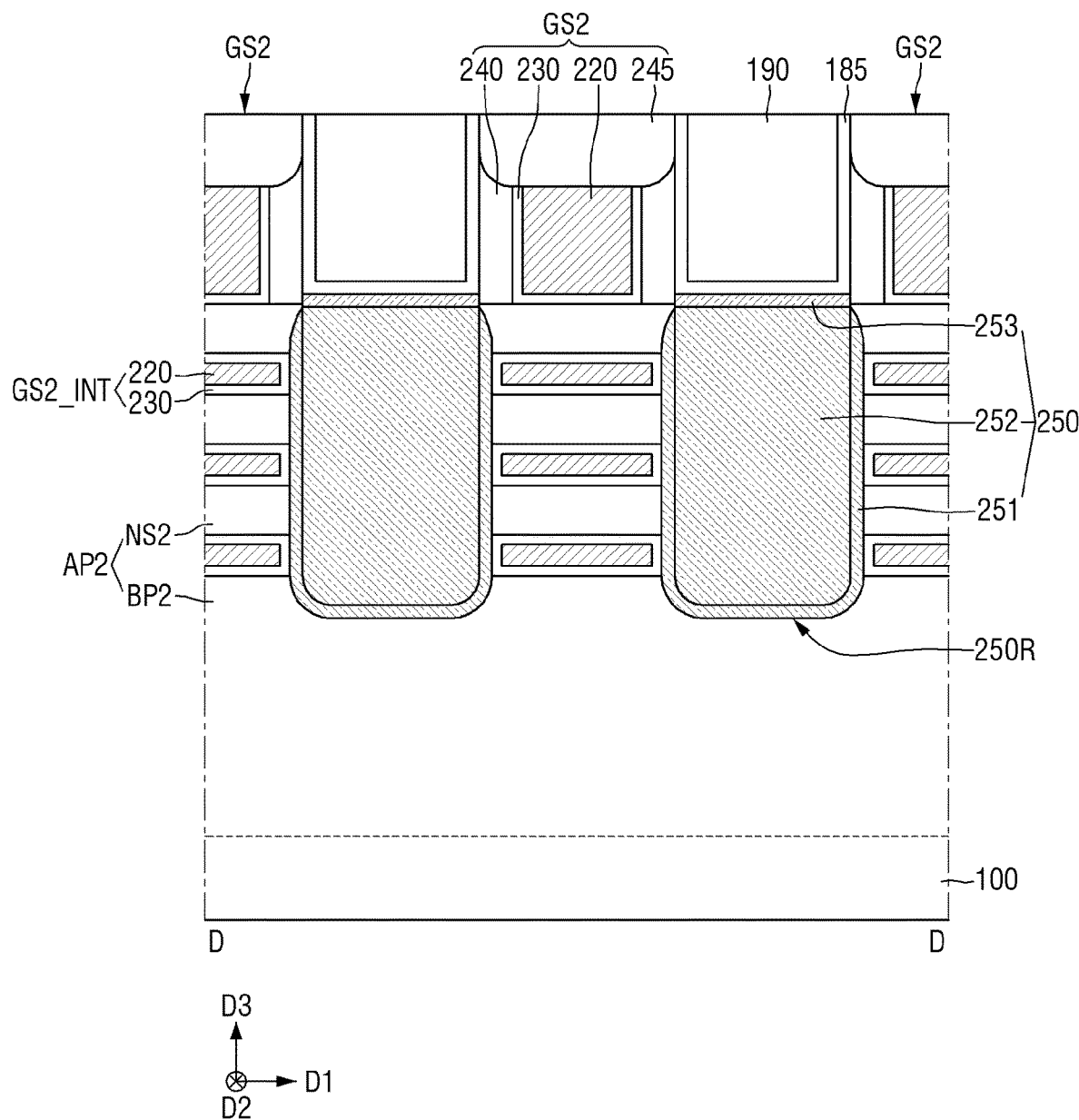
FIG. 21 is a cross-sectional view taken along line D-D of FIG. 20.

FIG. 20 is a layout view of a semiconductor device according to some embodiments of the present disclosure. FIG. 21 is a cross-sectional view taken along line D-D of FIG. 20.

In detail, a cross-sectional view taken along line A-A of FIG. 20 may be the same as one of FIGS. 2, 5, 6, and 8 through 18. A first region I of FIG. 20 may be substantially the same as its counterpart of any one of FIGS. 1 through 19. Thus, the embodiment of FIGS. 20 and 21 will hereinafter be described, focusing mainly on a second region II of FIG. 20.

Referring to FIGS. 20 and 21, the semiconductor device according to some embodiments of the present disclosure may include the first active pattern AP1, the plurality of first gate electrodes 120, a second active pattern AP2, a plurality of second gate electrodes 220, and second source/drain patterns 250.

The substrate 100 may include the first and second regions I and II. The first region I may be a region where an NMOS is formed, and the second region II may be a region where a PMOS is formed.

The first active pattern AP1 and the first gate electrodes 120 may be disposed in the first region I of the substrate 100. The second active pattern AP2 and the second gate electrodes 220 may be disposed in the second region II of the substrate 100.

The second active pattern AP2 may include a second lower pattern BP2 and a plurality of second sheet patterns NS2. The second lower pattern BP2 may protrude from the substrate 100. The second lower pattern BP2 may extend in the first direction D1. The second sheet patterns NS2 may be disposed on the second lower pattern BP2. The second sheet patterns NS2 may be spaced apart from the second lower pattern BP2 in the third direction D3.

The second lower pattern BP2 and the second sheet patterns NS2 may include one of an element semiconductor material (e.g., Si or Ge), a group IV-IV compound semiconductor, and a group III-V compound semiconductor. The second lower pattern BP2 may be a Si lower pattern including Si, and the second sheet patterns NS2 may be Si sheet patterns including Si.

The second gate structures GS2 may be disposed on the substrate 100. The second gate structures GS2 may extend in the second direction D2. The second gate structures GS2 may be spaced apart from one another in the first direction D1.

The second gate structures GS2 may be disposed on the second active pattern AP2. The second gate structures GS2 may intersect the second active pattern AP2. The second gate structures GS2 may intersect the second lower pattern BP2. The second gate structures GS2 may surround the second sheet patterns NS2.

The second gate structures GS2 may include, e.g., the second gate electrodes 220, second gate insulating films 230, second gate spacers 240, and second gate capping patterns 245.

The second gate structures GS2 may include second inter-gate structures GS2_INT, which are disposed between the second sheet patterns NS2 that are adjacent to one another in the third direction D3 and between the second lower pattern BP2 and the second sheet patterns NS2. The second inter-gate structures GS2_INT may include the second gate electrodes 220 and the second gate insulating films 230, and the second gate electrodes 220 and the second gate insulating films 230 are disposed between the second sheet patterns NS2 and between the second lower pattern BP2 and the second sheet patterns NS2.

The second gate spacers 240, unlike first gate spacers 140, may not include inner spacers (e.g., inner spacer 142 of the first gate spacers 140). That is, the second gate insulating films 230 may be in contact with the second source/drain patterns 250.

The second gate electrodes 220, the second gate insulating films 230, the second gate spacers 240, and the second gate capping patterns 245 are substantially the same as the first gate electrodes 120, first gate insulating films 130, the first gate spacers 140, and first gate capping patterns 145, respectively. Thus, detailed descriptions thereof will be omitted.

The second source/drain patterns 250 may be formed on the second active pattern AP2. The second source/drain patterns 250 may be formed on the second lower pattern BP2. The second source/drain patterns 250 may be connected to the second sheet patterns NS2.

The second source/drain patterns 250 may be disposed on sides of the second gate structures GS2. The second source/drain patterns 250 may be disposed between the second gate structures GS2, which are adjacent to one another in the first direction D1. For example, the second source/drain patterns 250 may be disposed on both sides of each of the second gate structures GS2. Alternatively, the second source/drain patterns 250 may be disposed on first sides of the second gate structures GS2, but not on second sides of the second gate structures GS2 that are opposite to the first sides of the second gate structures GS2.

The second source/drain patterns 250 may be included in the sources/drains of transistors using the second sheet patterns NS2 as channel regions. The second source/drain patterns 250 may be disposed in second source/drain recesses 250R. The bottom surfaces of the second source/drain recesses 250R may be defined by the second lower pattern BP2. Sidewalls of the second source/drain recesses 250R may be defined by the second sheet patterns NS2 and the second gate structures GS2. Specifically, the second gate structures GS2 (particularly, the second gate insulating films 230) may define parts of the second source/drain recesses 250R.

The second source/drain patterns 250 may include lower semiconductor patterns 251, upper semiconductor patterns 252, and capping semiconductor patterns 253. The lower semiconductor patterns 251, the upper semiconductor patterns 252, and the capping semiconductor patterns 253 may be epitaxial semiconductor regions.

The lower semiconductor patterns 251 and the upper semiconductor patterns 252 may include SiGe. In other words, the lower semiconductor patterns 251 and the upper semiconductor patterns 252 may include SiGe films. For example, the Ge fraction of the lower semiconductor patterns 251 is smaller than the Ge fraction of the upper semiconductor patterns 252.

The lower semiconductor patterns 251 and the upper semiconductor patterns 252 may include doped p-type impurities. The p-type impurities may be, e.g., boron (B).

The capping semiconductor patterns 253 may be formed on the lower semiconductor patterns 251 and the upper semiconductor patterns 252. The capping semiconductor patterns 253 may include, e.g., silicon (Si). While double-layer SiGe semiconductor patterns are illustrated as being disposed below the capping semiconductor patterns 253, the present disclosure is not limited thereto.

FIGS. 22 through 32 are cross-sectional views of stages in a method of fabricating a semiconductor device according to some embodiments of the present disclosure. FIGS. 22 through 32 are cross-sectional views taken along line A-A of FIG. 1 and illustrate how to fabricate, e.g., the semiconductor device of FIGS. 1 through 7.

Figure 22:
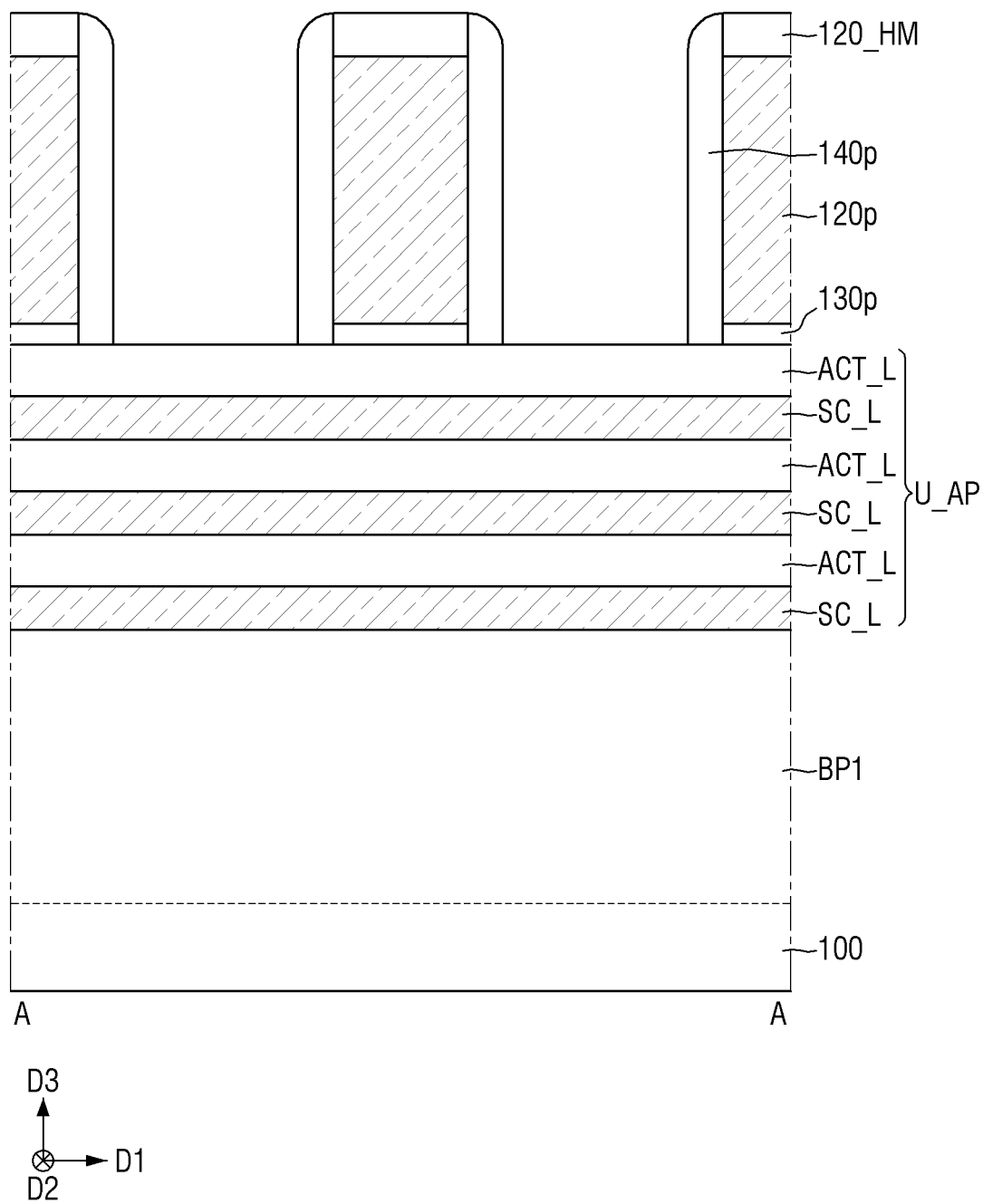
FIGS. 22 through 32 are cross-sectional views of stages in a method of fabricating a semiconductor device according to some embodiments.

Referring to FIG. 22, a first lower pattern BP1 and an upper pattern structure U_AP may be formed on the substrate 100.

The upper pattern structure U_AP may be disposed on the first lower pattern BP1. The upper pattern structure U_AP may include sacrificial patterns SC_L and active patterns ACT_L, which are alternately stacked on the first lower pattern BP1. For example, the sacrificial patterns SC_L may include SiGe films, and the active patterns ACT_L may include Si films.

Thereafter, dummy gate insulating films 130, dummy gate electrodes 120p, and dummy gate capping films 120_HM may be formed on the upper pattern structure U_AP. The dummy gate insulating films 130p may include, e.g., silicon oxide. The dummy gate electrodes 120 may include, e.g., polysilicon. The dummy gate capping films 120_HM may include, e.g., silicon nitride. First pre-gate spacers 140P may be formed on sidewalls of the dummy gate electrodes 120p.

Figure 23:
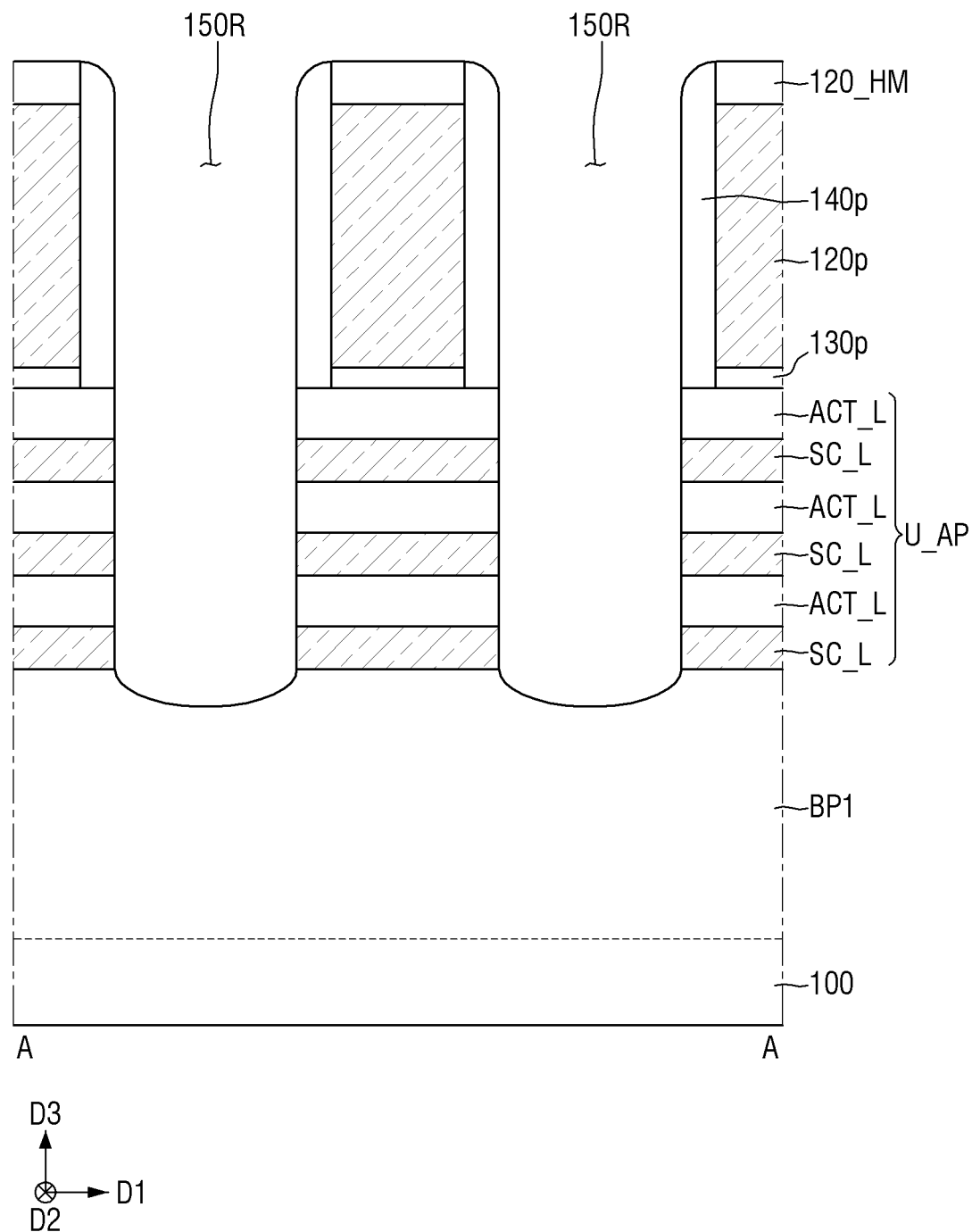

Referring to FIG. 23, the first source/drain recesses 150R may be formed in the upper pattern structure U_AP using the dummy gate electrodes 120p as a mask. Parts of the first source/drain recesses 150R may be formed in the first lower pattern BP1. The bottom surfaces of the first source/drain recesses 150R may be defined by the first lower pattern BP1.

Figure 24:
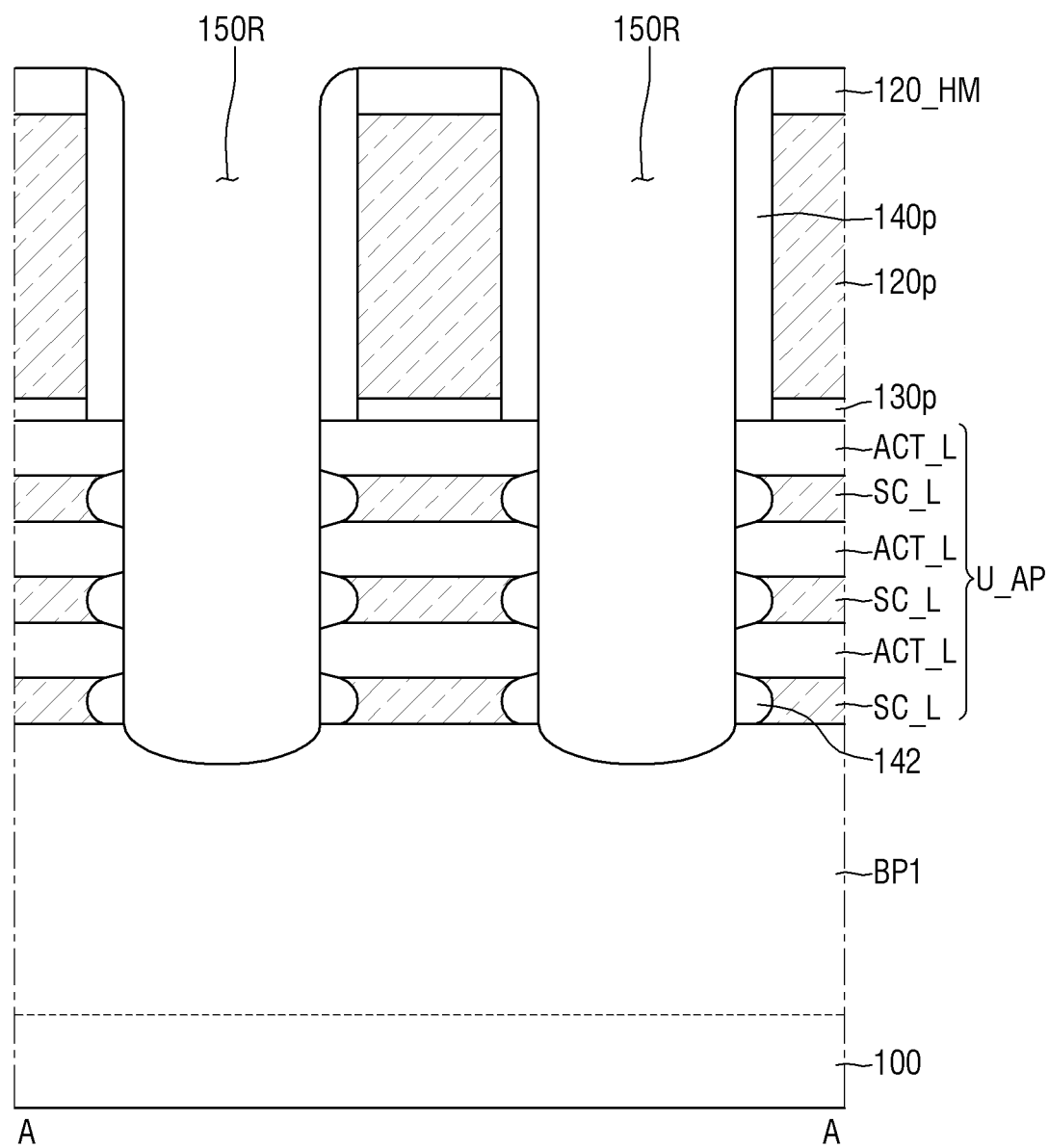
Figure 24:
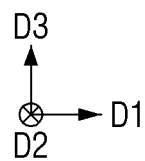

Referring to FIG. 24, parts of the sacrificial patterns SC_L, exposed by the first source/drain recesses 150R, may be removed. Thereafter, inner spacers 142 may be formed at locations where the sacrificial patterns SC_L are partially removed.

Figure 25:
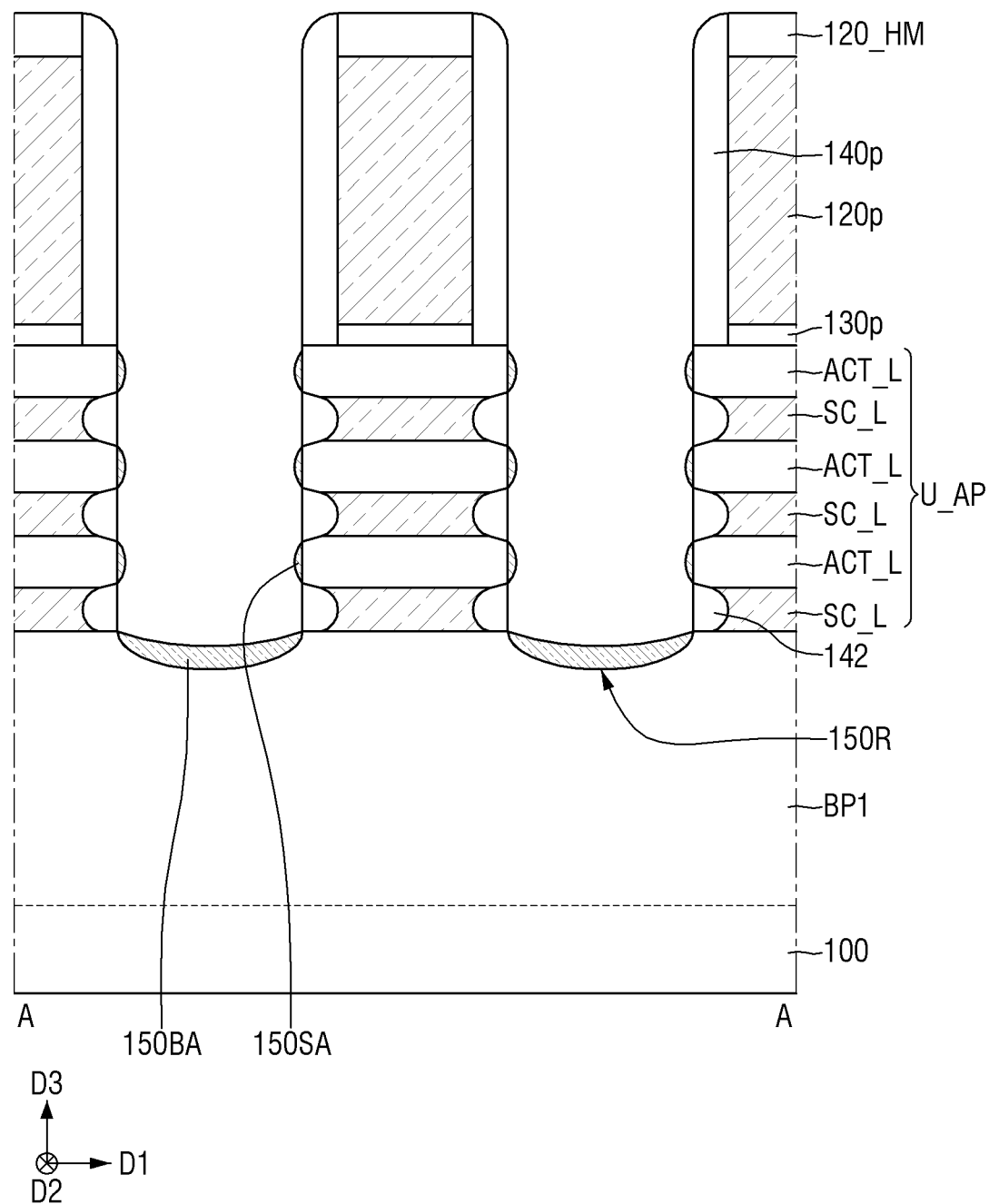

Referring to FIG. 25, first pre-epitaxial regions 150BA may be formed along the bottom surfaces of the first source/drain recesses 150R.

During the formation of the first pre-epitaxial regions 150BA, dummy epitaxial regions 150SA may be formed on parts of the active patterns ACT_L that are exposed. The first pre-epitaxial regions 150BA and the dummy epitaxial regions 150SA may be formed by, e.g., an epitaxial growth method.

During the epitaxial growth of the first pre-epitaxial regions 150BA and the dummy epitaxial regions 150SA, the first lower pattern BP1 and the active patterns ACT_L may all be exposed. Thus, the first pre-epitaxial regions 150BA and the dummy epitaxial regions 150SA may be formed together. By controlling the process parameters of the epitaxial growth of the first pre-epitaxial regions 150BA and the dummy epitaxial regions 150SA, the first pre-epitaxial regions 150BA may be formed to have a greater thickness in the third direction D3 than the thickness, in the first direction D1, of the dummy epitaxial regions 150SA.

Figure 26:
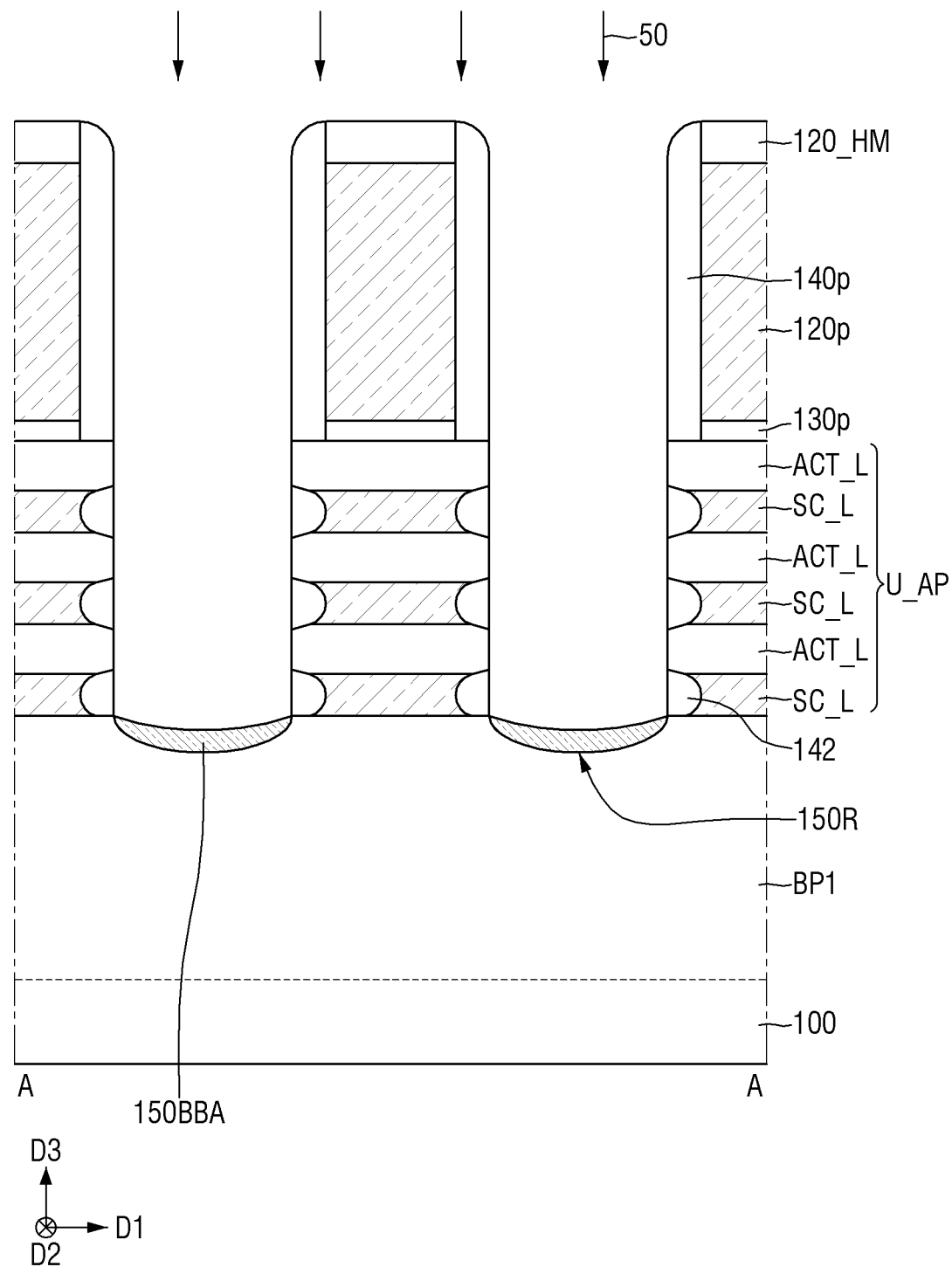

Referring to FIGS. 25 and 26, the dummy epitaxial regions 150SA may be removed by trimming 50.

While the dummy epitaxial regions 150SA are being etched, the first pre-epitaxial regions 150BA may also be partially removed. However, as the thickness, in the third region D3, of the first pre-epitaxial regions 150BA is greater than the thickness, in the first direction D1, of the dummy epitaxial regions 150SA, the first pre-epitaxial regions 150BA may not be entirely removed. As a result of the trimming 50, first trimming epitaxial regions 150BAA may be formed along the bottom surfaces of the first source/drain recesses 150R.

Figure 27:
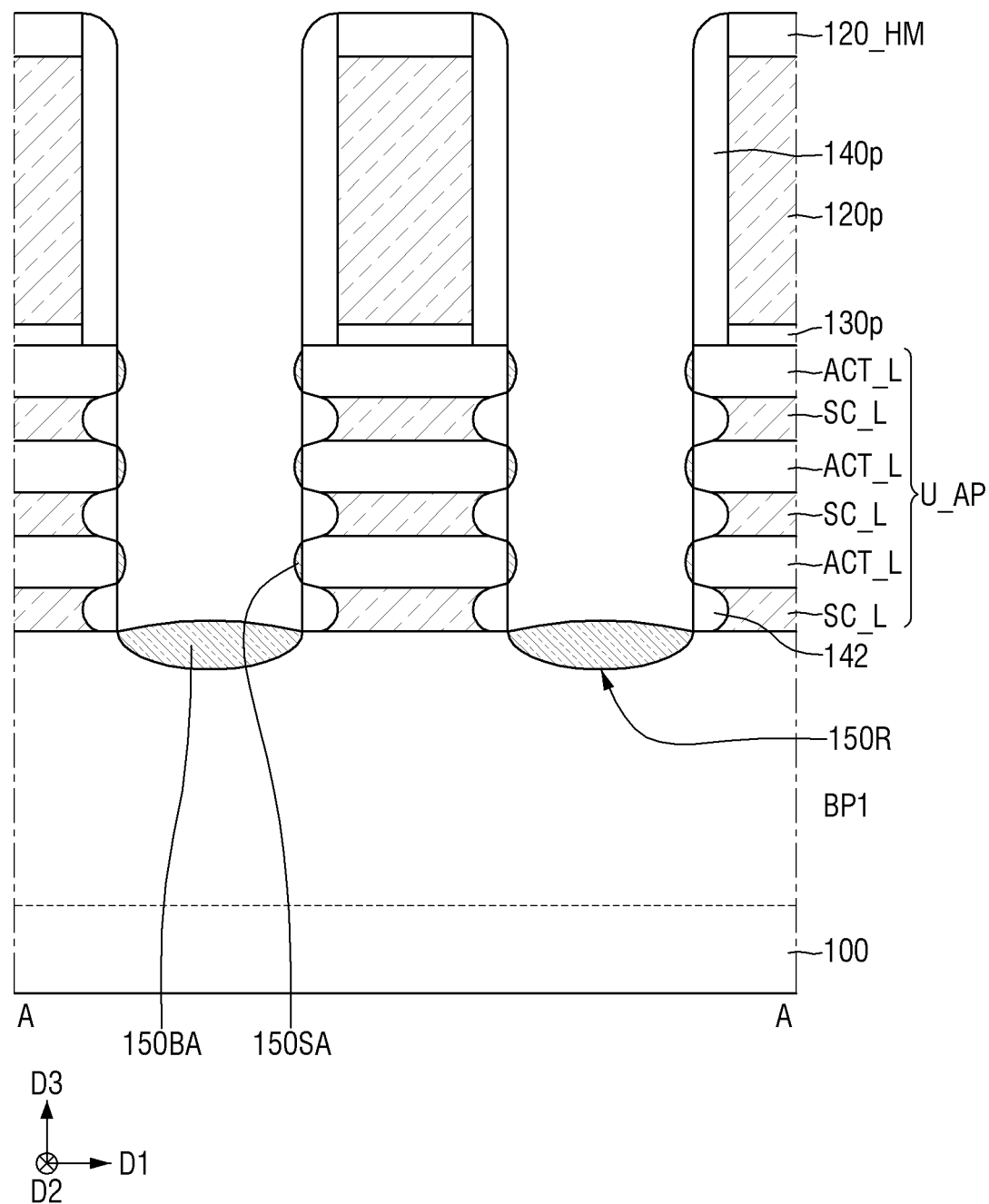

Referring to FIGS. 26 and 27, second pre-epitaxial regions 150BB may be formed along the bottom surfaces of the first source/drain recesses 150R. The second pre-epitaxial regions 150BB may be obtained by forming additional epitaxial regions on the first trimming epitaxial regions 150BAA.

During the formation of the second pre-epitaxial regions 150BB, dummy epitaxial regions 150SA may be formed on the exposed parts of the active patterns ACT_L. The second pre-epitaxial regions 150BB and the dummy epitaxial regions 150SA may be formed by, e.g., an epitaxial growth method.

Figure 28:
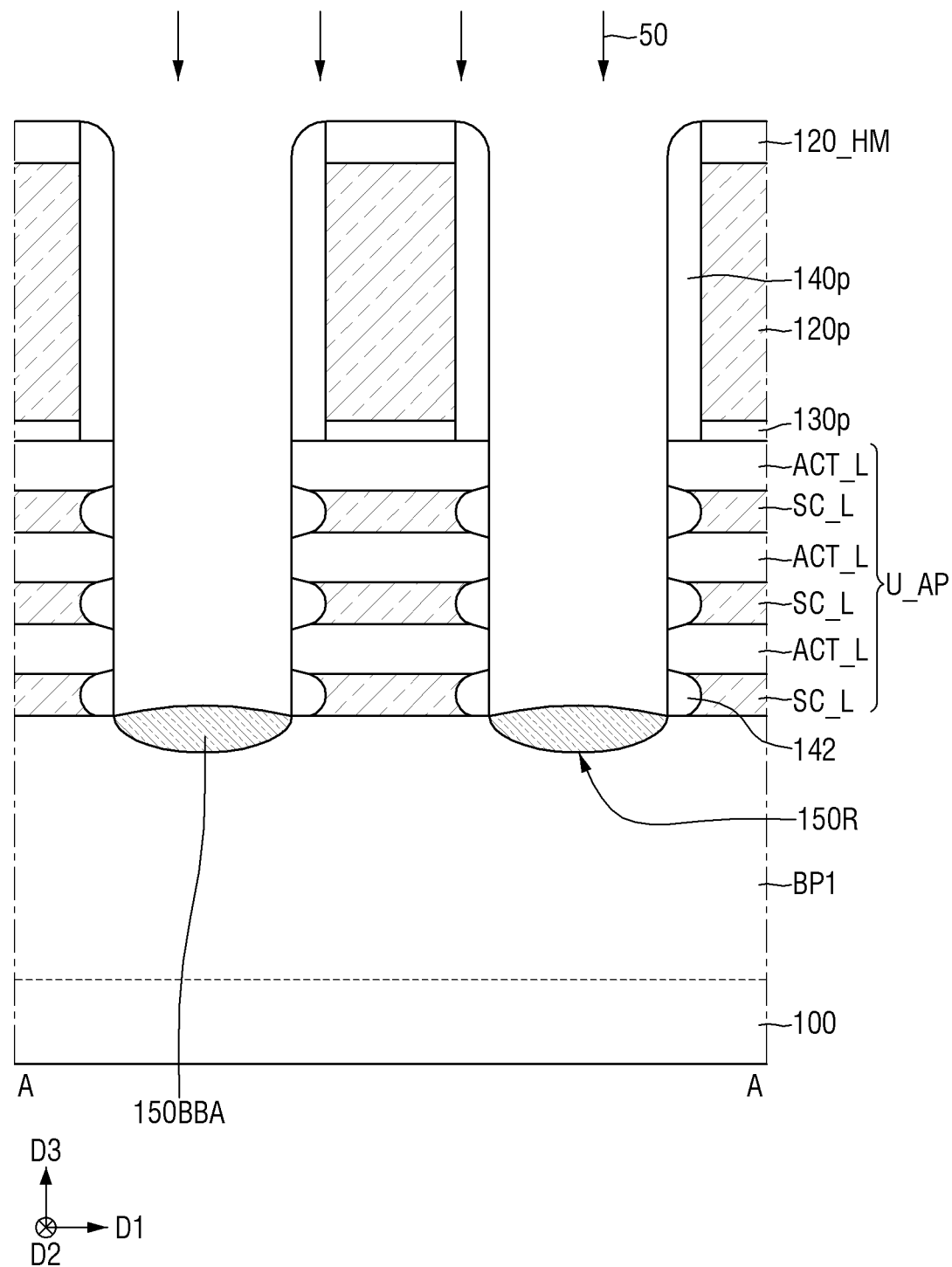

Referring to FIGS. 27 and 28, the dummy epitaxial regions 150SA may be removed by trimming 50. While the dummy epitaxial regions 150SA are being etched, the second pre-epitaxial regions 150BB may also be partially removed.

As a result of trimming 50, second trimming epitaxial regions 150BBA may be formed along the bottom surfaces of the first source/drain recesses 150R. Epitaxial growth and trimming 50 may be repeatedly performed.

Figure 29:
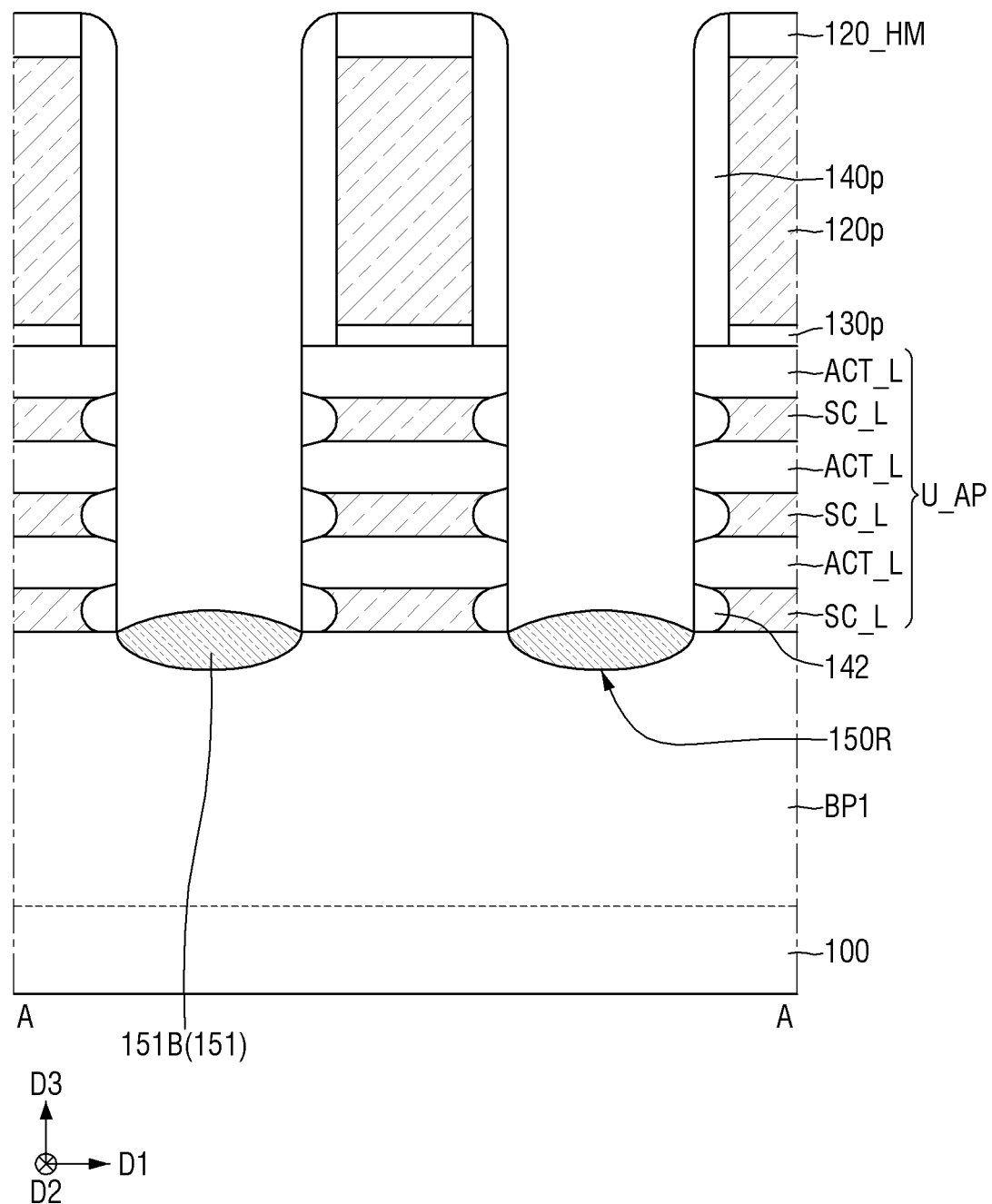

Referring to FIG. 29, the first epitaxial regions 151 may be formed along the bottom surfaces of the first source/drain recesses 150R. The first epitaxial regions 151 include the bottom parts 151B. The bottom parts 151B of the first epitaxial regions 151 may be formed by a cyclic growth method. The cyclic growth method may refer to a method in which epitaxial growth and trimming (50 of FIG. 28) are repeatedly performed.

Figure 30:
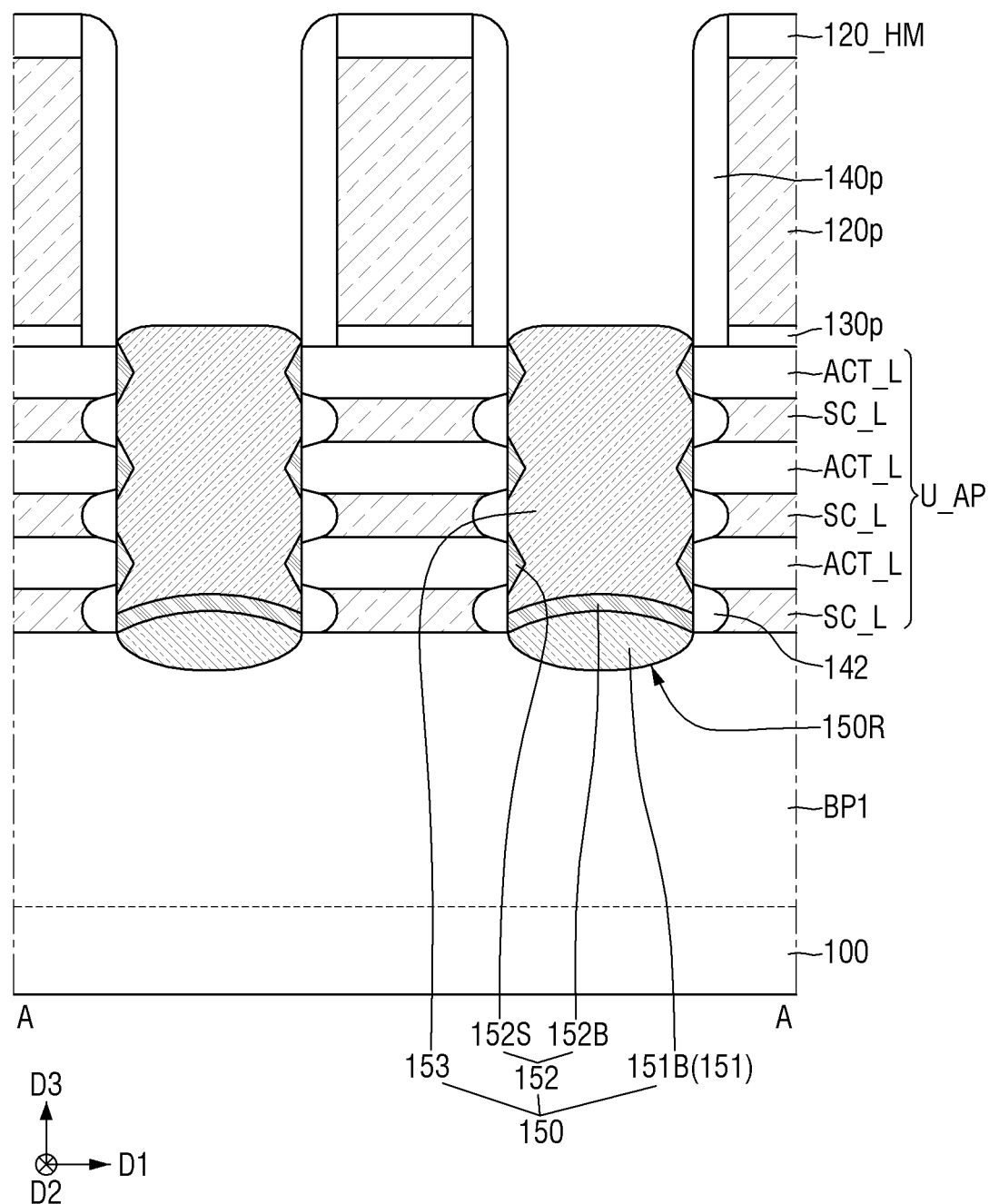

Referring to FIG. 30, the second epitaxial regions 152 may be formed on the first epitaxial regions 151. Thereafter, the third epitaxial regions 153 may be formed on the second epitaxial regions 152. In this manner, first source/drain patterns 150 may be formed in the first source/drain recesses 150R. The second epitaxial regions 152 and the third epitaxial regions 153 may be formed by an epitaxial growth method.

Figure 31:
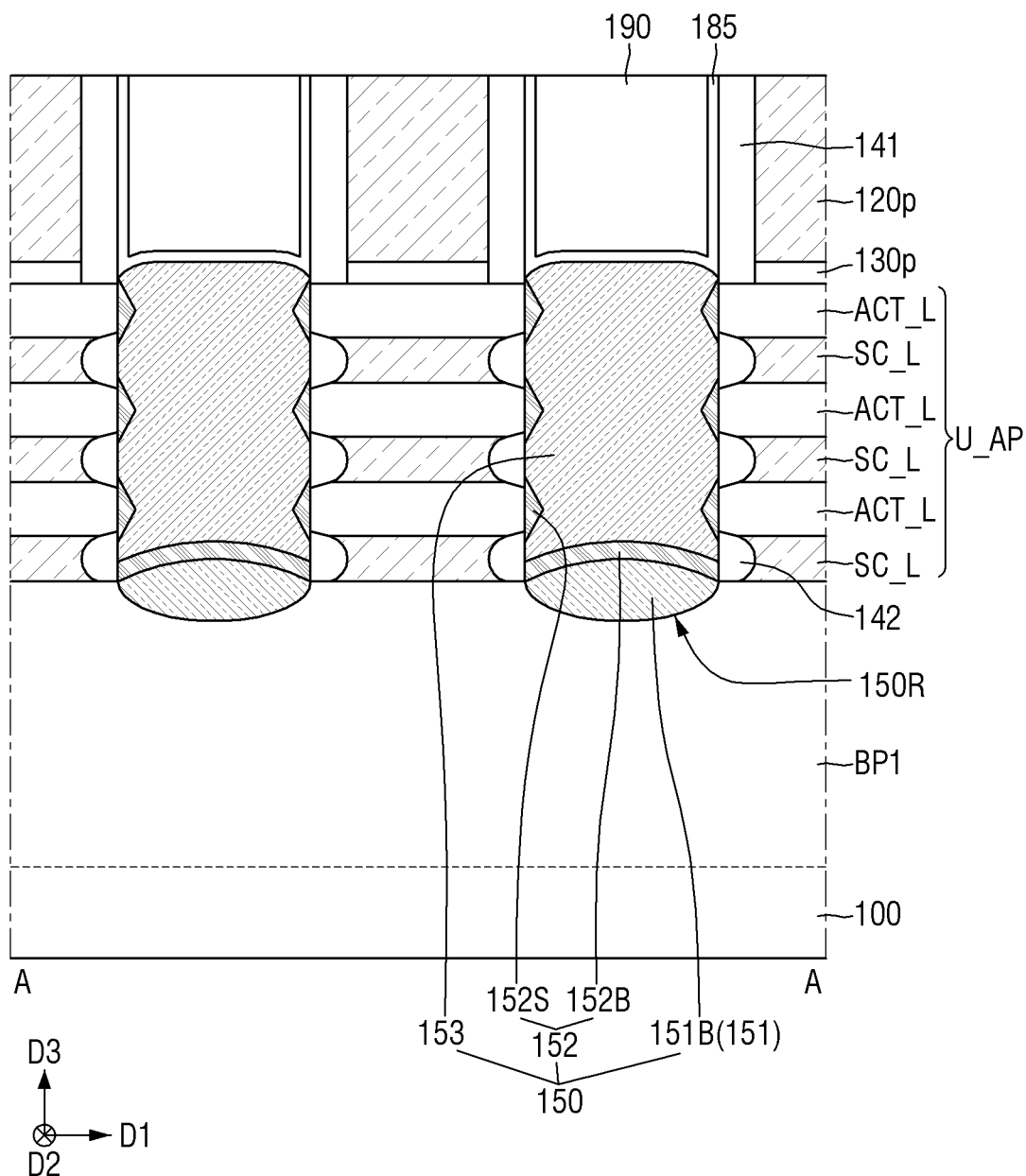

Referring to FIG. 31, the etch stopper films 185 and the interlayer insulating films 190 are sequentially formed on the first source/drain patterns 150.

Thereafter, the upper surfaces of the dummy gate electrodes 120p are exposed by removing parts of the interlayer insulating films 190, parts of the etch stopper films 185, and the dummy gate capping films 120_HM. While the upper surfaces of the dummy gate electrodes 120p are being exposed, outer spacers 141 may be formed.

Figure 32:
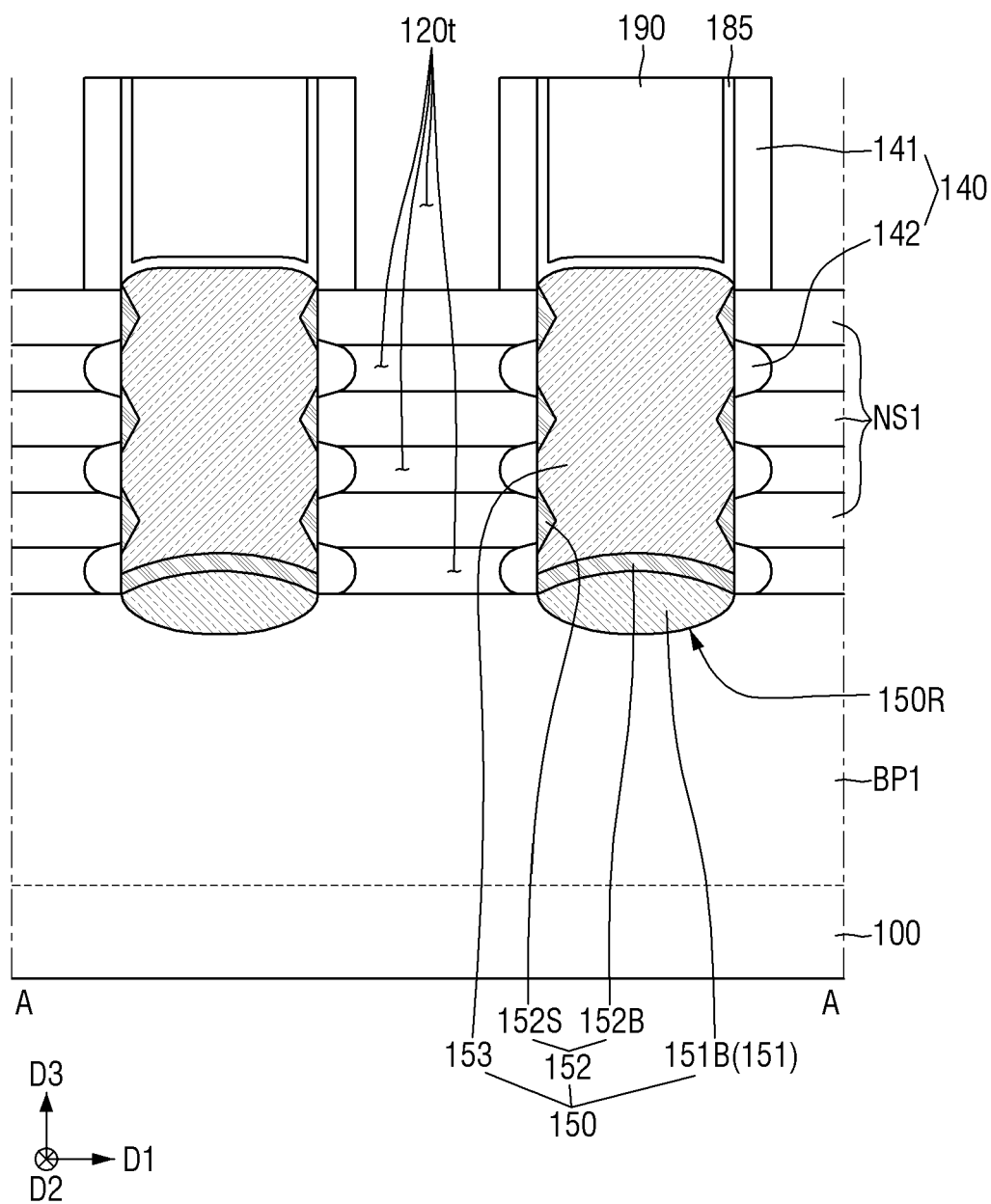

Referring to FIGS. 31 and 32, the upper pattern structure U_AP may be exposed between the first gate spacers 140 by removing the dummy gate insulating films 130p and the dummy gate electrodes 120p. Thereafter, first sheet patterns NS1 may be formed by removing the sacrificial patterns SC_L. In this manner, gate trenches 120t are formed between the first gate spacers 140. Once the sacrificial patterns SC_L are removed, the inner spacers 142 may be exposed.

Thereafter, referring to FIG. 2, first gate insulating films 130 and first gate electrodes 120 may be formed in the gate trenches 120t. Also, first gate capping patterns 145 may be formed in the gate trenches 120t.

By way of summation and review, example embodiments of the present disclosure provide a semiconductor device capable of improving performance and reliability. That is, according to example embodiments, parts of the source/drain regions are doped with heavy metals, e.g., antimony (Sb) or bismuth (Bi), which have a relatively lower diffusion coefficient in silicon than phosphorus or arsenic, thereby minimizing bottom leakage currents and controlling the short channel effect.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an active pattern including a lower pattern and sheet patterns, the sheet patterns being spaced apart from the lower pattern in a first direction;
   a source/drain pattern on the lower pattern, the source/drain pattern being in contact with the sheet patterns; and
   gate structures on opposite sides of the source/drain pattern, the gate structures being spaced apart from each other along a second direction and including gate electrodes that surround the sheet patterns,
   wherein the source/drain pattern includes:
   a first epitaxial region including first impurities, which include at least one of antimony and bismuth, the first epitaxial region having a bottom part in contact with the lower pattern, but not with the sheet patterns, and with respect to the second direction away from the gate structures, a thickness of the bottom part increases and then decreases, and a second epitaxial region on the first epitaxial region, the second epitaxial region including second impurities, which include phosphorus.

2. The semiconductor device as claimed in claim 1, wherein:
the source/drain pattern further includes a third epitaxial region along an upper surface of the bottom part of the first epitaxial region, the third epitaxial region being in contact with the sheet patterns, and
the third epitaxial region includes third impurities, the third impurities including arsenic (As).

3. The semiconductor device as claimed in claim 2, wherein the third epitaxial region includes:
a bottom part in contact with the bottom part of the first epitaxial region; and
sidewall parts in contact with the sheet patterns, the bottom part of the third epitaxial region not being in contact with the sidewall parts of the third epitaxial region.

4. The semiconductor device as claimed in claim 3, wherein:
the gate structures include inner spacers between sheet patterns that are adjacent to one another in the first direction, and
the sidewall parts of the third epitaxial region cover parts of sidewalls of the inner spacers.

5. The semiconductor device as claimed in claim 2, wherein:
the gate structures include inner spacers between sheet patterns that are adjacent to one another in the first direction, and
the third epitaxial region is continuous along an upper surface of the bottom part of the first epitaxial region, the inner spacers, and the sheet patterns.

6. The semiconductor device as claimed in claim 2, wherein the third impurities are included at a concentration of 1E20 ($/cm^3$) to 2E21 ($/cm^3$).

7. The semiconductor device as claimed in claim 1, wherein:
the first epitaxial region further includes sidewall parts in contact with the sheet patterns, and
the sidewall parts of the first epitaxial region are not in contact with the bottom part of the first epitaxial region.

8. The semiconductor device as claimed in claim 7, wherein the second epitaxial region is in contact with the sidewall parts and the bottom part of the first epitaxial region.

9. The semiconductor device as claimed in claim 7, wherein:
the gate structures include inner spacers between sheet patterns that are adjacent to one another in the first direction, and
the sidewall parts of the first epitaxial region cover parts of sidewalls of the inner spacers.

10. The semiconductor device as claimed in claim 7, wherein:
the sidewall parts of the first epitaxial region include first and second sidewall parts that are spaced apart from each other in the first direction,
the source/drain pattern further includes a third epitaxial region connecting the first and second sidewall parts of the first epitaxial region, and
the third epitaxial region being doped with arsenic.

11. The semiconductor device as claimed in claim 1, wherein:
the sheet patterns include a lowermost sheet pattern that is a closest sheet pattern to the lower pattern,
the gate structures include inner spacer between the lowermost sheet pattern and the lower pattern, and
the bottom part of the first epitaxial region covers a part of a sidewall of the inner spacer.

12. The semiconductor device as claimed in claim 1, wherein:
the first impurities are at a concentration of 5E19 ($/cm^3$) to 3E21 ($/cm^3$), and
the second impurities are at a concentration of 2E21 ($/cm^3$) to 6E21 ($/cm^3$).

13. A semiconductor device, comprising:
an active pattern including a lower pattern and sheet patterns, the sheet patterns being spaced apart from the lower pattern in a first direction;
a source/drain pattern on the lower pattern and in contact with the sheet patterns; and
gate structures on opposite sides of the source/drain pattern, the gate structures being spaced apart from each other in a second direction, and the gate structures including gate electrodes that surround the sheet patterns,
wherein the source/drain pattern includes:
a first epitaxial region in contact with the lower pattern, the first epitaxial region including silicon doped with at least one of antimony and bismuth,
a second epitaxial region in contact with the sheet patterns, the second epitaxial region including silicon doped with arsenic, and
a third epitaxial region on the first and second epitaxial regions, the third epitaxial region including silicon doped with phosphorus.

14. The semiconductor device as claimed in claim 13, wherein the second epitaxial region includes:
a bottom part along an upper surface of the first epitaxial region, and
sidewall parts in contact with the sheet patterns, the bottom part of the second epitaxial region is not in contact with the sidewall parts of the second epitaxial region.

15. The semiconductor device as claimed in claim 13, wherein:
the gate structures include inner spacers between sheet patterns that are adjacent to one another in the first direction, and
the second epitaxial region is continuous along an upper surface of the first epitaxial region, the inner spacers, and the sheet patterns.

16. A semiconductor device, comprising:
an active pattern including a lower pattern and sheet patterns, the sheet patterns being spaced apart from the lower pattern in a first direction, and the sheet patterns including a lowermost sheet pattern, which is a closest sheet pattern to the lower pattern;
a source/drain pattern on the lower pattern and in contact with the sheet patterns, the source/drain pattern including:
a first epitaxial region doped with antimony, the first epitaxial region being in contact with the lower pattern; and
a second epitaxial region doped with phosphorus; and
gate structures on opposite sides of the source/drain pattern, the gate structures being spaced apart from each other in a second direction, and the gate structures including:

gate electrodes surrounding the sheet patterns, and a lowermost inner spacer between the lower pattern and the lowermost sheet pattern, the first epitaxial region having a bottom part covering a part of a sidewall of the lowermost inner spacer.

17. The semiconductor device as claimed in claim 16, wherein, with respect to the second direction away from the gate structures, a thickness of the bottom part of the first epitaxial region increases and then decreases.

18. The semiconductor device as claimed in claim 16, wherein:
- the source/drain pattern further includes a third epitaxial region along an upper surface of the bottom part of the first epitaxial region and is in contact with the sheet patterns,
- the third epitaxial region includes a bottom part in contact with the bottom part of the first epitaxial region, and sidewall parts, which are in contact with the sheet patterns, but not with the bottom part of the third epitaxial region, and
- the third epitaxial region includes doped arsenic.

19. The semiconductor device as claimed in claim 16, wherein:
- the source/drain pattern further includes a third epitaxial region, which covers an upper surface of the bottom part of the first epitaxial region, the sidewall of the lowermost inner spacer, and a sidewall of the lowermost sheet pattern, and
- the third epitaxial region includes doped arsenic.

20. The semiconductor device as claimed in claim 19, wherein:
- the third epitaxial region further includes sidewall parts, which are in contact with the sheet patterns, and
- the sidewall parts of the third epitaxial region are not in contact with the bottom part of the first epitaxial region.

* * * * *